United States Patent [19]
Nishizawa

[11] Patent Number: 5,323,029
[45] Date of Patent: Jun. 21, 1994

[54] STATIC INDUCTION DEVICE
[75] Inventor: Jun-ichi Nishizawa, Sendai, Japan
[73] Assignee: Zaidan Hojin Handotai Kenkyu Shinkokai, Miyagi, Japan
[21] Appl. No.: 24,780
[22] Filed: Mar. 2, 1993
[30] Foreign Application Priority Data
   Mar. 4, 1992 [JP] Japan .................. 4-081374
[51] Int. Cl.⁵ .............. H01L 29/74; H01L 29/10; H01L 29/78
[52] U.S. Cl. .................. 257/136; 257/132; 257/154; 257/162; 257/332; 257/334
[58] Field of Search ............... 257/132, 134, 135, 136, 257/133, 154, 162, 327, 332, 334

[56] References Cited
U.S. PATENT DOCUMENTS
4,574,310 3/1986 Nishizawa et al. ............ 257/136
4,631,592 12/1986 Nishizawa .................... 257/136
5,001,535 3/1991 Nishizawa et al. ............ 257/146
5,038,188 8/1991 Nishizawa et al. ............ 257/136
5,086,330 2/1992 Minato ....................... 257/134

FOREIGN PATENT DOCUMENTS
3-292770 12/1991 Japan .

Primary Examiner—Ngan Ngo
Attorney, Agent, or Firm—Fish & Richardson

[57] ABSTRACT

A static induction device (SI device) at least shares a structure in which an SI thyristor, an IGT and a capacitor are merged onto the single monolithic chip. The SI thyristor has a cathode, an anode and a gate regions, and a channel. The IGT has a well on a surface of the channel, a source and drain regions within the well, a gate insulating film on the well, and a gate electrode on the gate insulating film. The capacitor comprises the gate region of the SI thyristor, the gate insulating film on the gate region, and the gate electrode. The cathode and the drain region are connected to each other through a high-conductive electrode.

13 Claims, 14 Drawing Sheets

STATIC INDUCTION DEVICE

BACKGROUND OF THE INVENTION

The present invention relates to a novel structure of a static induction power device such as a static induction thyristor (hereinafter referred to as an "SI thyristor") and, more particularly, to a structure of a MOS controlled SI thyristor capable of simplifying a gate drive circuit.

In recent years, various MOS controlled power devices, or MOS gated power devices such as MCT (MOS-controlled Thyristor), EST (Emitter-Switched Thyristor), DMT (Deletion Mode Thyristor) have been proposed. However, each of these MOS controlled power devices has, as a main device a conventional type thyristor such as GTO, and a MOS transistor, integrated on the same monolithic chip. Since the ON-voltage of these MOS controlled power devices is determined by a characteristic of the main device, they have the disadvantages that ON-voltage and conduction loss are high. It is difficult to bring these MOS controlled power devices to a high frequency use.

In view of the above, a MOS controlled SI thyristor (hereinafter referred to as a "MCSITH") which expects high efficiency and high-speed operation and whose main thyristor is an SI thyristor, a device essentially low in both ON-voltage and conduction loss and capable of being operated at a high speed or high frequency, has already been proposed in Japanese Patent Application No. HEI 2-95251 (Japanese Patent Laid-Open No. HEI 3-292770) by the same Applicant as the present invention. The MCSITH is one which has, as shown in FIG. 23 and FIG. 24 (which is a cross-sectional view taken along a line XXIII—XXIII in FIG. 23), a structure in which a MOS transistor is integrated between a gate and a cathode of a normally-off SI thyristor.

FIG. 23 is a top plan view, while FIG. 24 is a cross-sectional view taken along a line A—A in FIG. 23. As shown in FIGS. 23 and 24, an SI thyristor is arranged such that an $n^+$ region 23 is a cathode, a $p^+$ region 21 is an anode, each of a pair of floating $p^+$ regions 31 is a gate, and an $n^-$ region 22 is a channel. Each of the $p^+$ regions 31 serves also as a source of a pMOS transistor in which a corresponding $p^+$ region 32 is a drain, and a high conductivity layer 25 such as a polysilicon silicon layer or the like is a gate electrode.

Turning-on of the MCSITH is realized by the application of a positive potential to a capacitor which comprises the $p^+$ gate region 31, the high conductivity layer 25 and an oxide film 26 that is an insulating film arranged on the $p^+$ gate region 31, reducing the height of a potential barrier formed within the $n^-$ channel 22 by means of capacitive coupling (static induction effects). Turning-off is achieved realized by short-circuiting the $p^+$ gate regions 31 and the $n^+$ cathode region 23 to each other with a PMOS transistor extracting a hole through the $p^+$ gate regions 31 to the cathode region 23.

However, this MCSITH has the following disadvantages. If impurity density of the $n^-$ channel 22 is approximately $10^{13}$ cm$^{-3}$, in order that the main thyristor has a normally-off characteristic, it is required that the spacing between the adjacent $p^+$ gate regions 31 and 31 is equal to or less than approximately 6 $\mu$m. Assuming that a diffusion width of the $n^+$ cathode stripe 23 is 2 $\mu$m, then it is required that the spacing between the $n^+$ cathode stripe 23 and the stripe of $p^+$ gate regions 31 is narrowed to 2 $\mu$m at one side. Accordingly, the gate length L of the pMOS transistor should have a value, which is equal to or less than 2 $\mu$m, for example, 1 $\mu$m or the like. Owing to the small impurity concentration of $10^{13}$ cm$^{-3}$, punch-through current incapable of being controlled by the gate electrode 25 always flows between the $p^+$ source region 31 and the $p^+$ drain region 32, and the main thyristor cannot be turned off. Particularly, since the depth of the $p^+$ gate regions 31 of the SI thyristor are deep such as, normally, 5~15 $\mu$m, the MCSITH has a disadvantage that the punch-through current is apt to flow as compared with a standard, discrete MOS transistor; the source and drain regions of the standard MOS transistor have a diffusion depth almost equal to or less than twice that of a gate length. Then, the MCSITH has a disadvantage that the diffusion depth of the $p^+$ source region 31 is equal to or more than 3~15 times the gate length of the pMOS transistor so that the punch-through current is very apt to flow.

Further, the aforesaid Japanese Patent Laid-Open No. HEI 3-292770 has proposed a structure in which, as shown in FIG. 25 and FIG. 26 (which is a cross-sectional view taken along a line XXV—XXV in FIG. 24), a pMOS transistor, comprising a $p^+$ source region 31, a $p^+$ drain region 32 and a gate electrode 25, is formed along the longitudinal direction of a cathode stripe 23. In this case, Japanese Patent Laid-Open No. HE 3-292770 has an advantage that a gate length L of the pMOS transistor can be selected independently of spacing between the $p^+$ gate regions 31 and 31 of the main thyristor.

However, the above-described structure has the following disadvantage. If the gate length L is lengthened to suppress the punch-through current of the pMOS transistor, the ON-resistance of the pMOS transistor is raised and the main thyristor cannot be turned off. Lengthening of the gate width w of the pMOS transistor in the structure illustrated in FIGS. 25 and 26 has a limit because of a restriction of the spacing between the $p^+$ gate regions 31 and 31 of the main thyristor. There is a trade-off between the condition under which the main thyristor is brought to the normally-off and a condition under which the ON-resistance of the pMOS transistor is reduced. Thus, it is difficult to simultaneously satisfy the both conditions.

Moreover, in the structures illustrated in FIGS. 23 through 26, since each of the $p^+$ gate regions 31 is under the floating condition, it is impossible to bring a metal electrode into direct contact with an upper portion of the $p^+$ diffused gate region 31 like a normal surface-gate SI thyristor. As a result, a resistance value of the $p^+$ gate region 31 is determined by a resistance of the diffused region. Thus, it is difficult to reduce a gate resistance. The above-described structure has also the following disadvantage. Since the $p^+$ gate resistance is high, maximum anode current that can be turned off and maximum forward blocking voltage of the main thyristor are small, and turning-off time is late.

SUMMARY OF THE INVENTION

It is an object of the invention to provide a static induction device (hereinafter referred to as an "SI device") such as a MCSITH having a novel structure, in which a main thyristor is a normally-off type, and leakage current or punch-through current in a pMOS transistor, or the like can be reduced.

It is another object of the invention to provide an SI device such as a MCSITH having a novel structure, in which it is possible to simultaneously satisfy a normally-off condition for which a main thyristor and a condition under which an ON-resistance of a pMOS transistor is reduced.

It is still another object of the invention to provide an SI device such as a MCSITH having a novel structure, in which a gate resistance of a main thyristor can be reduced, and a capacitance of a capacitor connected to a gate for turning-on is capable of increasing.

According to the invention, there is provided an SI device comprising:

an SI thyristor at least having a cathode region of first conductivity type having high impurity concentration, an anode and a pair of gate regions of second conductivity type having high impurity concentration, and a channel of first conductivity type having low impurity concentration;

an insulated gate transistor (hereinafter referred to as an "IGT") at least having a well of first conductivity type formed on a part of a surface of the channel, the well having impurity concentration higher than that of the channel, a drain region of second conductivity type having high impurity concentration, the drain region being formed within the well, a source region that is one of the same region as the gate region or a region of second conductivity type having high impurity concentration, which is electrically connected to the gate region, a gate insulating film formed on the well area, and a gate electrode formed on the gate insulating film; and a capacitor comprising the gate region of the SI thyristor, the gate insulating film formed on the gate region, and the gate electrode of the IGT, wherein the SI thyristor, the IGT and the capacitor are merged onto th single monolithic chip, wherein the cathode and the drain region at least have a structure connected to each other through a cathode electrode, and wherein control voltage is applied to the gate electrode to control conduction and blocking of main current flowing between the cathode and the anode region.

According to the invention, there is further provided an SI device comprising:

an SI thyristor at least having a cathode region of first conductivity type having high impurity concentration, an anode and a pair of gate regions of second conductivity type having high impurity concentration, and a channel of first conductivity type having low impurity concentration;

an IGT at least having a well of first conductivity type formed on a part of a surface of the channel, the well having impurity concentration higher than that of the channel, a drain region of second conductivity type having high impurity concentration, the drain being formed within the well, a source region that is one of the same region as the gate region or a region of second conductivity type having high impurity concentration, which is electrically connected to the gate region, a gate insulating film formed on the well, and a gate electrode formed on the gate insulating film; and a capacitor comprising the gate region of the SI thyristor, the gate insulating film formed on the gate region and the gate electrode of the IGT, wherein the SI thyristor, the IGT and the capacitor are merged onto the single monolithic chip, wherein the SI device at least has a structure in which the cathode and the drain regions are connected to each other through a cathode electrode, and a isolation region between the drain and the gate regions is formed on at least a part of an region which does not become the channel of the IGT, and wherein control voltage is applied to the gate electrode to control conduction and blocking of main current flowing between the cathode and the anode regions.

According to the invention, there is also provided an SI device comprising:

an SI thyristor at least having a cathode region of first conductivity type having high impurity concentration, an anode and a pair of gate regions of second conductivity type having high impurity concentration, floating gate electrodes formed in contact with the gate regions, and a channel of first conductivity type having low impurity concentration;

an IGT at least having a well of first conductivity type formed on a part of a surface of the channel, the well having impurity concentration higher than that of the channel, a drain region of second conductivity type having high impurity concentration, the drain being formed within the well, a source region that is one of the same area as the gate region or the region of second conductivity type having high impurity concentration, which is electrically connected to the gate region, a first gate insulating film formed on the well, and a gate electrode formed on the first gate insulating film;

a first capacitor comprising the gate region of the SI thyristor, the first gate insulating film formed on the gate region and the gate electrode of the IGT formed on the first gate insulating film; and a second capacitor comprising the gate electrode, a second gate insulating film formed at least on a part of one of an upper or a side portion of the gate electrode, and the floating gate electrode formed on one of an upper or a side portion of the second gate insulating film, wherein the SI thyristor, the IGT, the first and the second capacitors are merged onto the single monolithic chip, wherein the SI device at least has a structure in which the cathode and the drain regions are connected to each other through a cathode electrode, and wherein control voltage is applied to the gate electrode to control conduction and blocking of main current flowing between the cathode and the anode regions.

According to the invention, there is provided an SI device comprising:

a double-gate SI thyristor at least having a semiconductor substrate having low impurity concentration, a cathode region of first conductivity type, being formed on a part of a first main surface of the semiconductor substrate, a pair of first gate regions of second conductivity type, a pair of second gate regions of first conductivity type and an anode region of second conductivity type, the anode being formed on a part of a second main surface which is opposed to the first main surface of the semiconductor substrate, an IGT at least comprising a well of second conductivity type formed on the second main surface, a drain region of first conductivity type being formed within said well, a source region of first conductivity type being electrically connected to the second gate region, a gate insulating film formed on the well, and a gate electrode on the gate insulating film, a capacitor comprising the second gate region, the gate insulating film and the gate electrode, wherein the double-gate SI thyristor, the IGT and the capacitor are merged onto the single monolithic chip, wherein control voltage is applied to the gate electrode to control conduction and blocking of main current flowing between the cathode and the anode region.

According to the invention, there is further provided an SI device comprising:

an SI thyristor at least having a cathode region of first conductivity type having high impurity concentration, an anode and a pair of gate regions of second conductivity type having high impurity concentration, floating gate electrodes formed in contact with the gate regions, and a channel of first conductivity type having low impurity concentration;

an IGT at least having a well of first conductivity type formed on a part of a surface of the channel, the well having impurity concentration higher than that of the channel, a drain region of second conductivity type having high impurity concentration, the drain being formed within the well, a source region of second conductivity type having high impurity concentration, the source being electrically connected to the gate region through the floating gate electrode, a first gate insulating film formed on the well, and a gate electrode formed on the first gate insulating film;

a first capacitor comprising the gate region of the SI thyristor, the first gate insulating film formed on the gate region, and the gate electrode; and a second capacitor comprising the gate electrode, a second gate insulating film formed at least on a part of one of an upper or a side portion of the gate electrode, and the floating gate electrode formed on one of an upper or a side portion of the second gate insulating film, wherein the SI thyristor, the IGT, the first and the second capacitors are merged onto a single monolithic chip, wherein the cathode and the drain regions are connected to each other through a cathode electrode, wherein the SI device has at least a structure in which the gate regions are formed in bottoms of grooves, the gate electrode is formed on the side walls of the grooves, and the well is formed on an end part of a convexed channel sandwiched in between the grooves in a longitudinal direction along the long side of planar pattern of the cathode stripe, and wherein control voltage is applied to the gate electrode to control conduction and blocking of main current flowing between the cathode and the anode regions.

With the above arrangement of the invention, since it is possible to select the impurity concentration of the channel of the SI thyristor and the IGT independently, it is possible to suppress the punch-through current between the source and drain of the IGT while the normally-off characteristic of the SI thyristor is maintained. Particularly, even if the depth of the p+ gate region of the SI thyristor is deep, such as 3~15 times the gate length of the IGT, it is possible to suppress the bulk punch-through current.

Moreover, with the arrangement of the invention, it is possible to bring the impurity doping concentration of the SI thyristor to a value equal to or less than $10^{12}$ cm$^{-3}$ while that of the well is maintained to a value sufficient to suppress the punch-through current. As a result, it is possible to widen the lateral spacing between the gate and gate regions of the SI thyristor to a value equal to or more than 10 μm. Thus, a lateral space for a lithography on the planar pattern increases.

Furthermore, with the other arrangement of the invention, unnecessary areas for the operation of the IGT between the gate regions of the SI thyristor and the drain of the IGT can be separated from each other by the isolation region. Accordingly, even if the spacing between the gates of the SI thyristor is sufficiently narrowed in order to obtain a normally-off characteristic, it is possible to design lateral parameters in which the gate width of the IGT increases.

Further, the arrangement of the invention, the high-conductive floating gate electrode such as metal can be directly in contact with the gate diffusion layer of the SI thyristor. Accordingly, even if the gate is under the floating condition, it is possible to sufficiently reduce the gate resistance of the SI thyristor. Furthermore, it is possible to maintain the capacitance connected to the p+ diffused gate region of the SI thyristor to a sufficiently large value.

As described above, the SI device according to the invention has the following advantages. The normally-off characteristic of the SI thyristor can be made excellent, and the bulk punch-through current between the source and drain of the IGT can be suppressed. Thus, the SI device can be turned on by the smaller gate voltage. The superior switching can be made possible with a high efficiency and with a high speed.

Further, the SI device according to the invention has the following advantage. Even if the impurity concentration of the channel of the SI thyristor of the main device is made sufficiently low, it is possible to suppress the punch-through current of the IGT. Thus, the spacing between the gate regions of the SI thyristor can be made large. The lateral space and the margin for misalignment and dimensional variation increases so that the manufacturing is made easy and the yield can be improved.

Furthermore, the SI device according to the invention has the following advantage. The well behaved normally-off characteristic of the SI thyristor and the reduced ON-resistance of the IGT can be simultaneously obtained. Accordingly, the turning-off characteristic of the MCSITH can be improved.

In addition, the SI device according to the invention has the following advantage. The gate resistance of the SI thyristor can be reduced to $\frac{1}{2} \sim 1/100$. Accordingly, the higher speed switching of the MCSITH is possible, and the forward blocking voltage and the current handling capability (turn-off anode current) can increase.

Moreover, the SI device according to the invention has the following advantage. Since the capacitance of the capacitor connected to the gate of the SI thyristor can be brought to an optimum value at which both the turning-on and turning-off time are reduced, high-speed switching is made possible.

Further, the SI device according to the invention has also the following advantage. Since the area occupied by the capacitor connected to the gate of the SI thyristor can be reduced, the area of the gate can be reduced, and relatively, the area of the channel through which the main current flows can increase as a whole. As a result, the current value per unit chip area increases, and the ON-resistance is reduced.

DESCRIPTION OF THE EMBODIMENTS

Various embodiments of the invention will hereunder be described with reference to the accompanying drawings.

Figure 1:
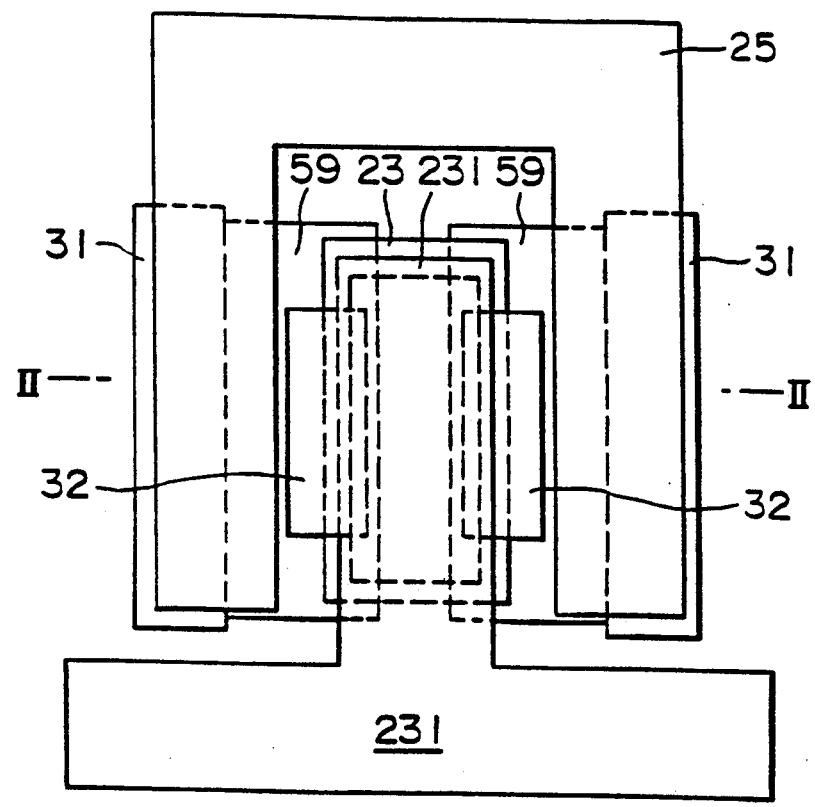
FIG. 1 is a top plan view showing a specific structure in which a MCSITH according to a first embodiment of an SI device of the invention is integrated.
Figure 2:
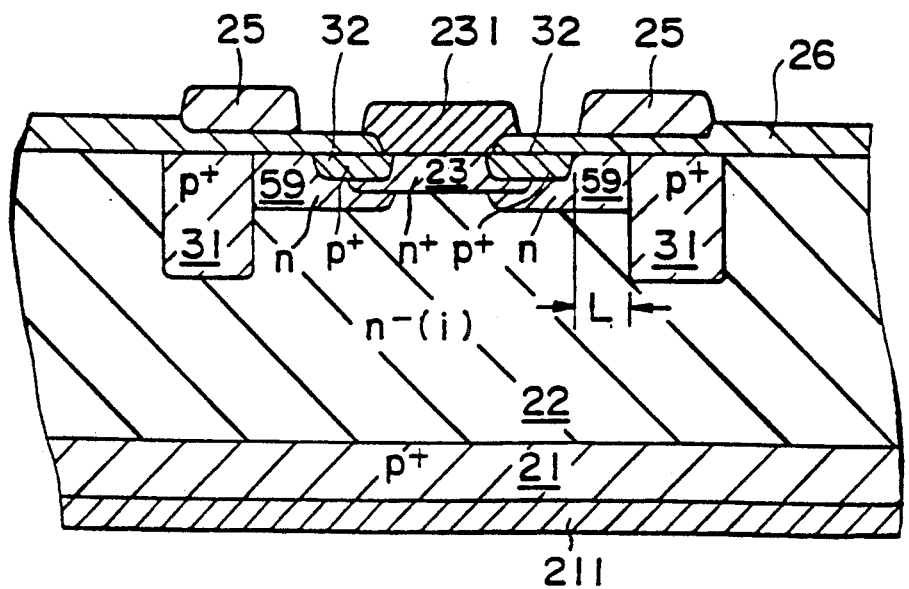
FIG. 2 is a cross-sectional view taken along a line II—II in FIG. 1.

FIG. 1 is a top plan view of a specific structure in which a MCSITH of a first embodiment of an SI device according to the invention is integrated, while FIG. 2 is a cross-sectional view taken along a line II—II in FIG. 1.

As shown in FIGS. 1 and 2, an $n^+$ region 23, a $p^+$ region 21, a pair of $p^+$ regions 31 and an $n^-$ region 22 are a cathode region, an anode region, a pair of gate regions and a channel of an SI thyristor, respectively. A pair of n-wells 59 each of which is higher in impurity concentration than the channel are formed between the $n^+$ region 23 and the pair of $p^+$ regions 31. The $p^+$ drain regions 32 of a pMOS transistor are formed within the n-wells 59, respectively. The $p^+$ region 31 is a source region of the pMOS transistor. The n-wells 59 have surfaces to which channel dope or the like is applied such that the pMOS transistors becomes depletion types (normally-on type).

A gate electrode 25 made of a polysilicon, a silicide film such as $WSi_2$, $TiSi_2$ or a refractory metal such as W or Mo serves also as a gate electrode of the nMOS transistor and a one-side of electrode of a capacitor. That is, a capacitor is formed by the gate electrode 25, an insulating film 26 such as an oxide film, and the $p^+$ region 31. The greater a capacitance of the capacitor, the shorter turning-on time of the SI thyristor. If, however, the capacitance of the capacitor increases so much, the capacitance stored in the gate of the SI thyristor increases so that the turning-off time is lengthened. Accordingly, there is an optimum value of the capacitance for decreasing both the turning-on and the turning-off times. The optimum value should be a value approximately $10 \sim 80$ times the capacitance (capacitance $C_{GK}$ between a gate and a cathode) which the gate region per se of the SI thyristor has. Accordingly, the thickness of the thin oxide film used as an insulating film on the $p^+$ gate diffusion region 31 should be equal to or less than 1000 Å, desirably, a value equal to $70 \sim 200$ Å.

The reference numeral 231 denotes a cathode electrode made of a metal such as Al, which connects the $n^+$ cathode region 23 and the $p^+$ drain regions 32 to each other. The reference numeral 211 denotes an anode electrode made of Al or the like. When the impurity concentration of the $n^-$ area 22 is low of approximately $10^{11} \sim 10^{13}$ cm$^{-3}$ to obtain the normally-off SI thyristor, and that of the n-well 59 for a pMOS transistor whose gate length L is equal to or less than 2 μm is approximately $10^{16}$ cm$^{-3}$, the punch-through current does not flow between the source and drain of the pMOS transistor. If the impurity concentration of the n-well 59 is approximately $10^{18}$ cm$^{-3}$, it is possible to form a pMOS transistor having a submicron gate length. Accordingly, the ON-resistance is extremely reduced, and leakage current due to the punch-through of the pMOS transistor is reduced. The impurity density of each of the $p^+$ regions 21, 31 and 32 is $10^{18} \sim 10^{20}$ cm$^{-3}$, and the $n^+$ region 23 is $10^{18} \sim 10^{21}$ cm$^{-3}$.

In the present embodiment, in order to turn on the SI thyristor, a positive voltage is applied to the gate electrode 25 to reduce the height of the potential barrier formed within the channel 22 through the capacitor connected to the upper portions of the $p^+$ gate region 31, by means of capacitive coupling (static induction effects) so that electrons are injected from the $n^+$ cathode region 23.

The injected electrons are accumulated adjacent to an interface between the $n^-$ channel 22 and the $p^+$ anode region 21. As a result, the potential barrier against a hole adjacent to the anode electrode 211 is quenched. Injection of the hole from the anode area 21 occurs. The hole further promotes injection of the electrons from the cathode region 23. Thus, the SI thyristor is turned on. At this time, the pMOS transistor of depletion type is in its off state, because positive voltage is applied to the gate electrode 25.

On the other hand, when the voltage applied to the gate electrode 25 is brought to 0 (zero) volt, the pMOS transistor is brought to a conducting state. The hole is extracted toward the cathode electrode 231 through the p+ region 31. The potential barrier for electrons in front of the cathode region 23 is raised. Thus, the SI thyristor is turned off.

Figure 3:
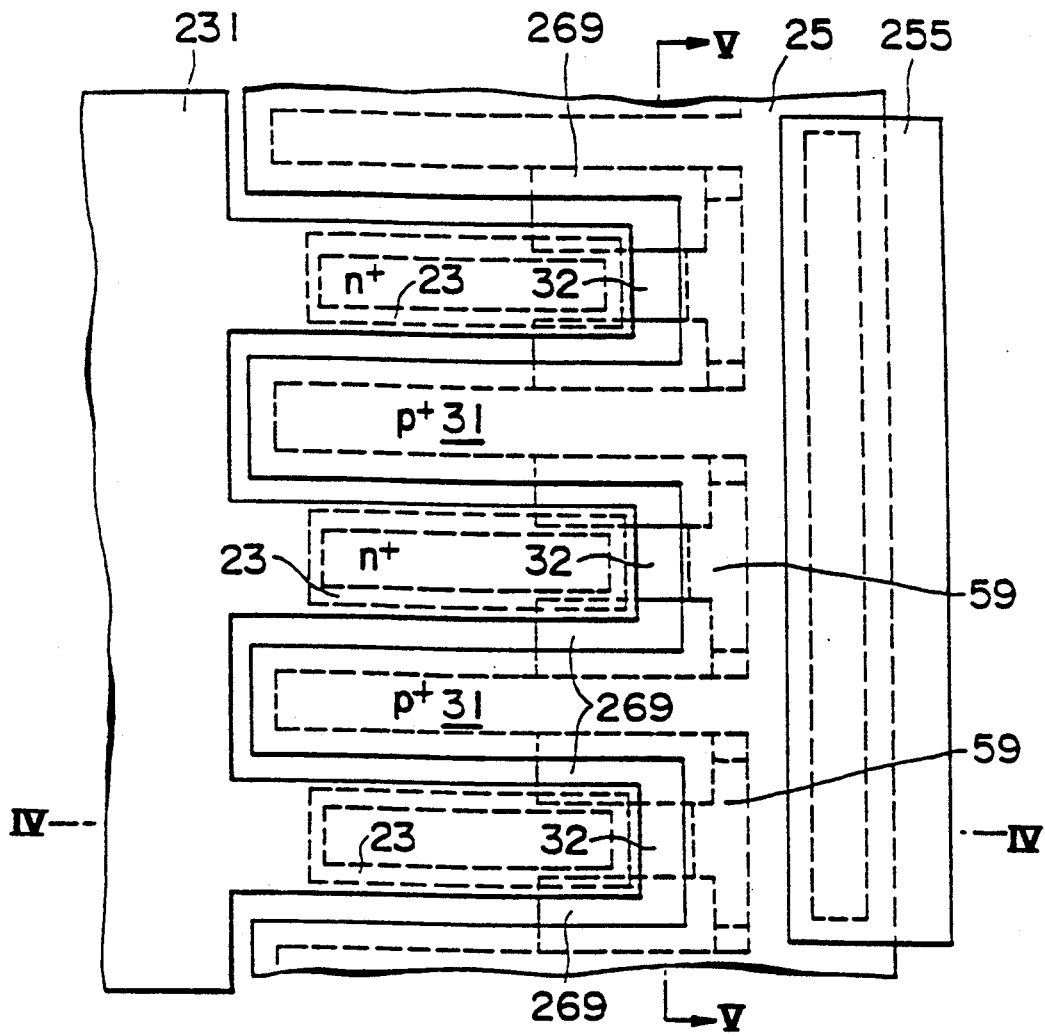
FIG. 3 is a top plan view showing a specific structure in which a MCSITH according to a second embodiment of the invention is integrated.
Figure 4:
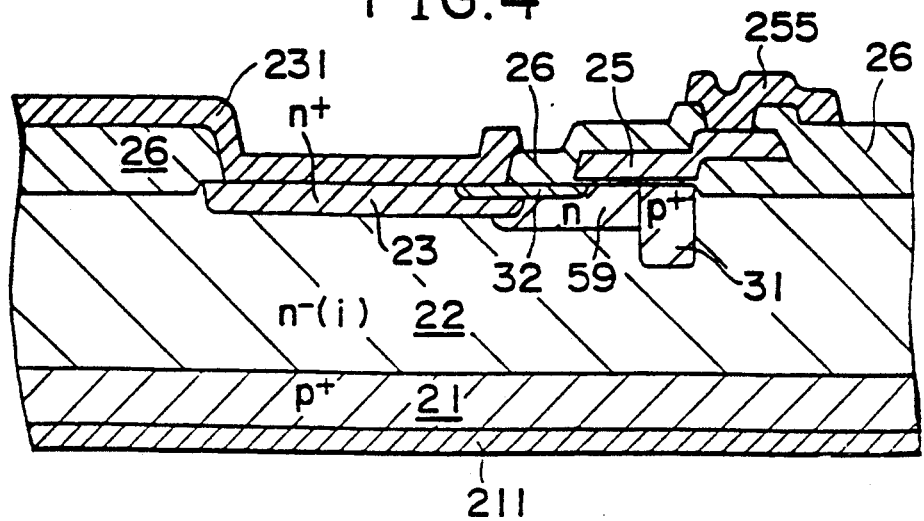
FIG. 4 is a cross-sectional view taken along a line IV—IV in FIG. 3.
Figure 5:
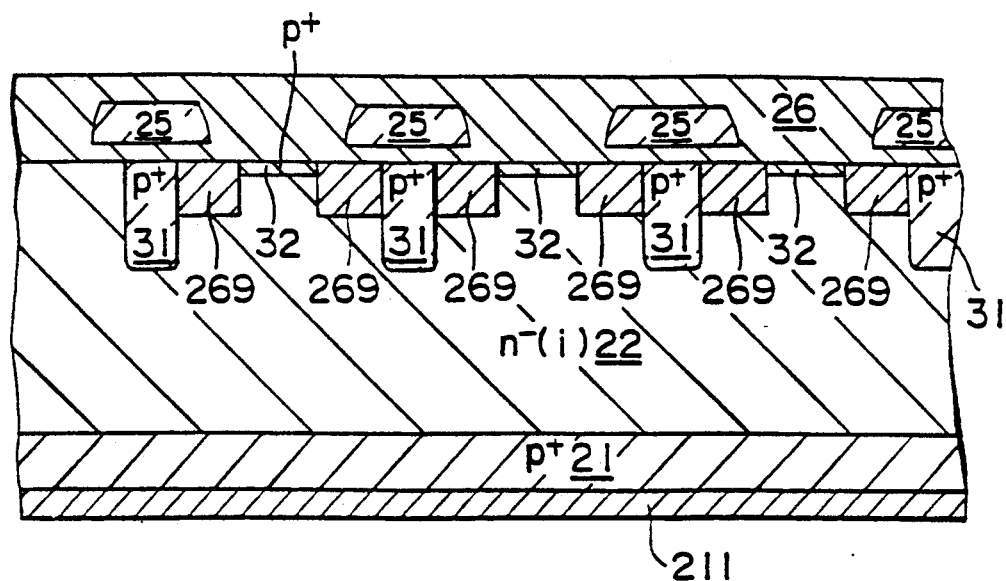
FIG. 5 is a cross-sectional view taken along a line V—V in FIG. 3.

FIG. 3 is a top plan view showing a specific structure in which a MCSITH according to a second embodiment of the invention is integrated, and FIG. 4 is a cross-sectional view taken along a line IV—IV in FIG. 3, while FIG. 5 is a cross-sectional view taken along a line V—V in FIG. 3. FIG. 3 through 5 show a portion of an SI thyristor of a multi-channel structure in which a plurality of unit cells are arranged in parallel relation to each other for large current.

Here, each of the pMOS transistors is formed longitudinally along the long side of n+ cathode stripes 23. By this structure, even if spacing between adjacent p+ gate regions 31 and 31 illustrated in FIG. 5 is narrowed, the gate length of the pMOS transistor can be selected as an independent parameter as shown in FIG. 4. Accordingly, adequate margin, or a space for misalignment and dimensional requirement of planar mask pattern are afforded and manufacturing is made easy.

As shown in FIGS. 3 and 5, U-shaped grooves or trenches are formed between the p+ gate regions 31 and a plurality of p+ drain regions 32. A plurality of insulating films 269 such as an oxide film are plugged respectively within the U-shaped grooves to form a plurality of isolation regions. It is needless to say that the interior of each of the U-shaped grooves is not perfectly plugged, but the interior of the U-shaped groove may have a hollow portion and the like. In this manner, because of the isolation region, it is easily possible to bring the lateral spacing between each of the p+ drain regions 32 and a corresponding one of the p+ gate regions 31 to a small value such as, approximately, submicron. If necessary, it is effective that a channel stop region consisting of the n+ region is formed at the bottom of the U-shaped groove. By this structure, it is possible to increase the gate width w of the pMOS transistor relatively, as compared with the spacing between the p+ gates. Accordingly, it is possible to bring the SI thyristor to a normally-off type, and to reduce the ON-resistance of the pMOS transistor.

Figure 6:
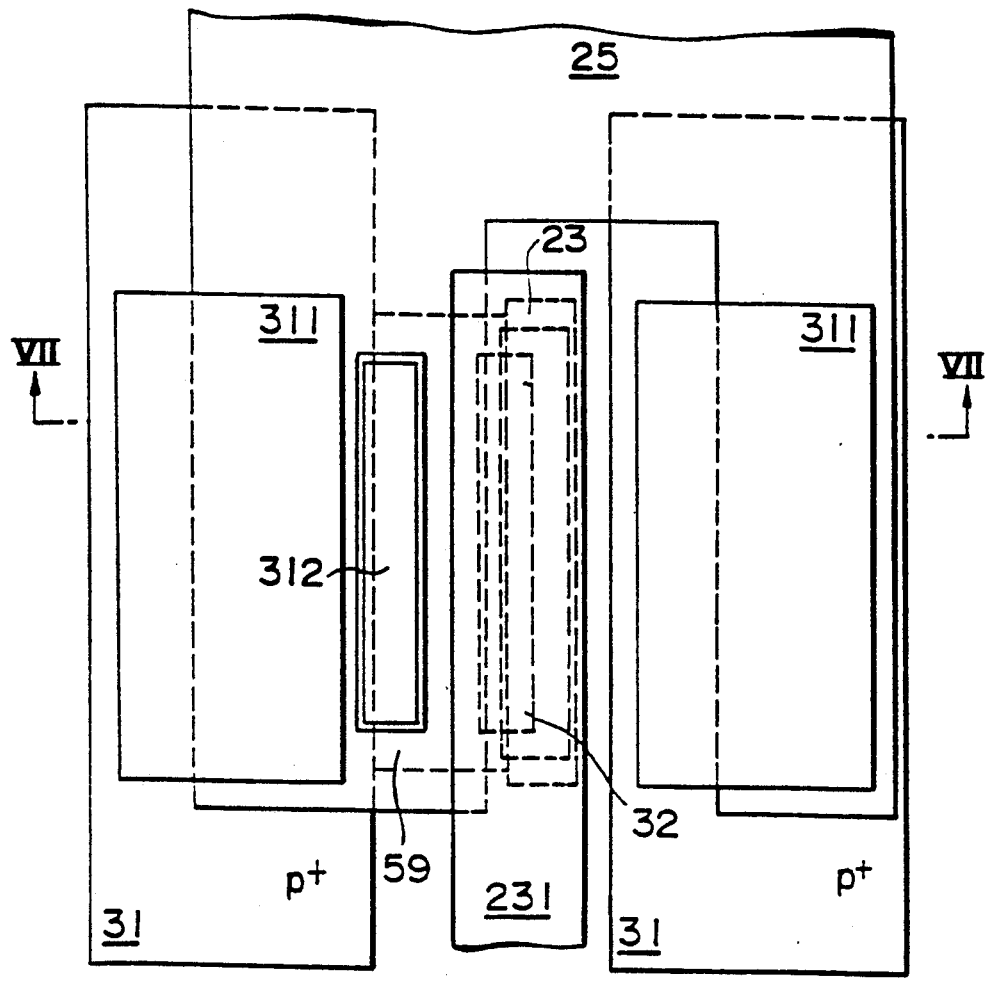
FIG. 6 is a top plan view showing a specific structure in which a MCSITH according to a third embodiment of the invention is integrated.
Figure 7:
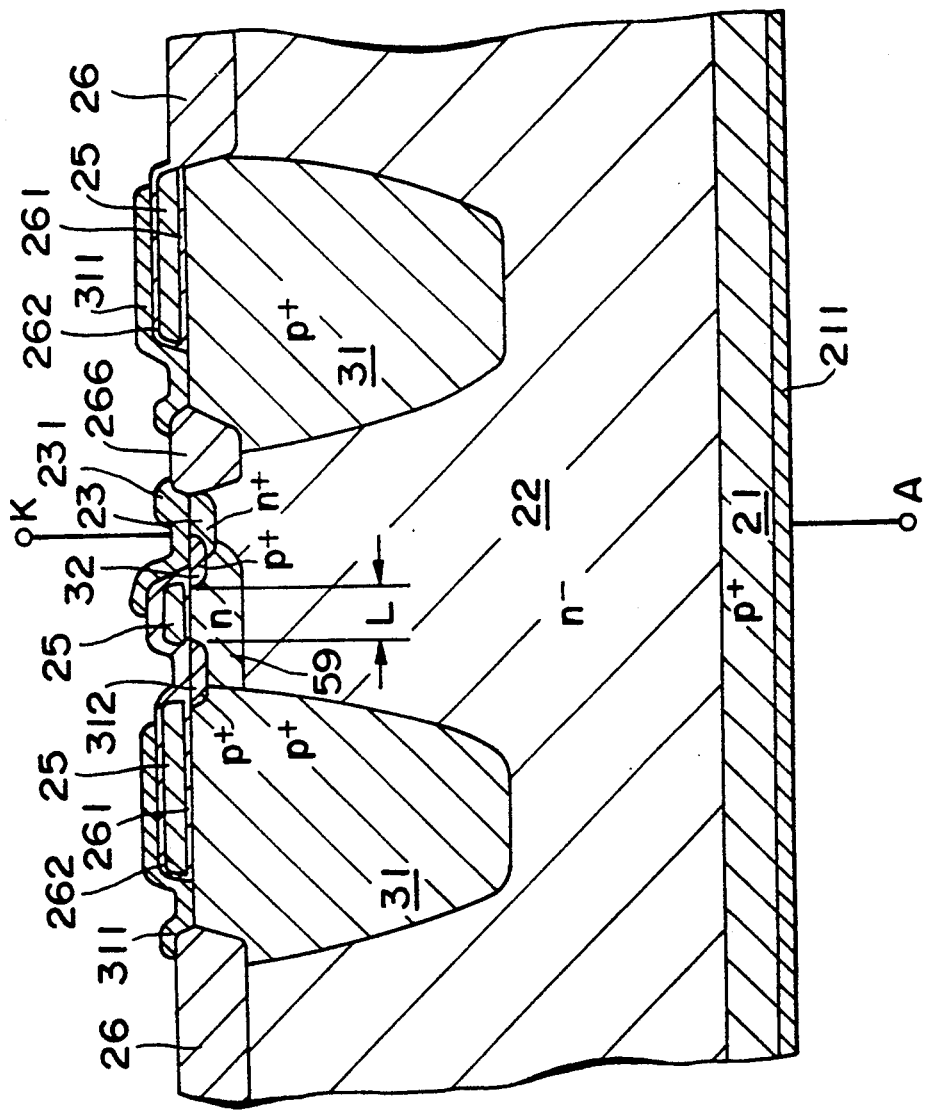
FIG. 7 is a cross-sectional view taken along a line VII—VII in FIG. 6.

FIG. 6 is a top plan view showing a specific structure in which a MCSITH according to a third embodiment of the invention is integrated, while FIG. 7 is a cross-sectional view taken along a line VII—VII in FIG. 6.

A p+ source region 312 and a p+ drain region 32 are formed within an n-well 59.

Differing to the source consisting of the deep p+ gate regions 31 shown in the first and second embodiments, the present embodiment uses a shallow source region 312 whose diffusion depth is same as that of the drain region 32. A gate electrode 25 is provided only on an upper portion of a channel of the pMOS transistor, and has a structure entirely same as a standard pMOS transistor. Each of the p+ regions 312 and 32, which are respectively the source and drain of the pMOS transistor, has a diffusion depth which is $0.5 \sim 1$ $\mu$m. The n-well 59 has impurity concentration which is $5 \times 10^{15}$ cm$^{-3} \sim 1 \times 10^{16}$ cm$^{-3}$, and has a diffusion depth which is $2 \sim 5$ $\mu$m. The pMOS transistor has a gate length which may be $1 \sim 2$ $\mu$m. An n+ cathode region 23 has impurity concentration of $4 \times 10^{19}$ cm$^{-3} \sim 1 \times 10^{21}$ cm$^{-3}$, and a diffusion depth of $1 \sim 2$ $\mu$m. Each of a pair of p+ gate regions 31 has impurity concentration of $1 \times 10^{18}$ cm$^{-3} \sim 2 \times 10^{19}$ cm$^{-3}$, and a diffusion depth of $6 \sim 15$ $\mu$m.

By the structure, source and drain regions are formed in a self-alignment manner. Even if misalignment shifting occurs in a masking step, the gate length L of the pMOS transistor is determined by the dimension of the mask, and does not fluctuate. As a result, the structure can be manufactured with an excellent yield. On this point, the first and second embodiments have a potential problem that the gate length of the pMOS transistor an fluctuate by photolith misalignment of the p+ gate 31 and the p+ drain regions 32 so that the ON-voltage of the pMOS transistor fluctuates, and a turning-off characteristic varies. However, the present embodiment can ensure that the gate length can be controlled.

In FIG. 7, the gate electrode 25 is formed by a polysilicon (doped polysilicon: DOPOS) to which impurity is added, refractory metals such as W, Ti, Mo or a silicide thereof. The reference numerals 311 denote floating gate electrodes made of a metal such as Al, which are directly in contact with the p+ diffusion regions 31, respectively, to reduce the gate resistance of the SI thyristor, thereby improving both the turning-off characteristic and the forward blocking voltage. As shown in FIG. 6, the floating gate electrodes 311 are provided for reducing the gate resistance of the SI thyristor. Accordingly, the floating gate electrodes 311 are not connected to a bonding pad or the like, and cannot electrically be driven from the external circuit. If necessary, however, a structure in which bonding pads are attached respectively to the floating gate electrodes 311 is also possible. It is desirable that contacting window portions between the floating gate electrodes 311 and the p+ gate region 31 are p+-rediffused to form regions having high doping concentration. Further, it is desirable that a silicide film is formed on each of the contacting window portions to reduce a contact resistance.

The reference numerals 261 denote first gate insulating films such as a thermal insulating film, while the reference numerals 262 denote second gate insulating films consisting of an oxide film of DOPOS, an oxide film of a refractory metal or a silicide thereof, or CVDSiO$_2$, or the like. As described above, it is necessary that the capacitance connected to the gate regions 31 of the SI thyristor is brought to an adequate value of approximately $10 \sim 80$ times the capacitance ($C_{GK}$) of the gate regions 31 per se of the SI thyristor. Because the first capacitor comprising the gate electrode 25, the first gate insulating film 261 and the p+ gate region 31 is connected in parallel with the second capacitor comprising the floating gate electrode 311, the second gate insulating film 262 and the gate electrodes 25, the capacitance connected to the gate regions of the SI thyristor increases to an optimum value, while the resistance of the SI thyristor decreases simultaneously, it is possible to improve both the turning-on and turning-off characteristics. In the first and second embodiments, there is a limit to the area occupied by the capacitor on the p+ region, from the point of view of an area occupying efficiency, and the capacitance cannot be increased to obtain the optimum value. In the case when the first gate insulating films 261 and the second gate insulating films 262 are formed by oxide films, respectively, it is preferable that the thickness of each of the oxide films is equal to or less than 1000 Å, desirably, a value of 100~200 Å.

In FIG. 7, the reference numeral 266 denotes an isolation region by insulating film, which prevents a breakdown voltage between the n+ cathode region 23 and the p+ gate region from being reduced, and which facilitates miniaturization of the gate spacing of the SI thyristor. The n− cathode region 23 is not arranged at the center of the channel, but is shifted toward one side. However, if the impurity concentration of an n− channel area 22 is brought to a sufficiently low value equal to or less than $10^{12}$ cm$^{-3}$, the spacing between the p+ gate regions 31 and 31 can be brought to equal to or more than 10 μm. In this case, the position of the n+ cathode region 23 could be located at a center of the channel, and there may be no need for isolation region by insulating film 266. After all, in the case when the SI thyristor does not have a normally-off characteristic owing to the rather high impurity concentration of the n− channel 22 such as $1.5 \times 10^{13}$ cm$^{-3} \sim 2 \times 10^{13}$ cm$^{-3}$ and the spacing between the p+ gate 31 and 31 such as equal to or less than 4.5 μm the n+ cathode region 23 should be shifted toward one side as shown in FIG. 7.

Figure 8:
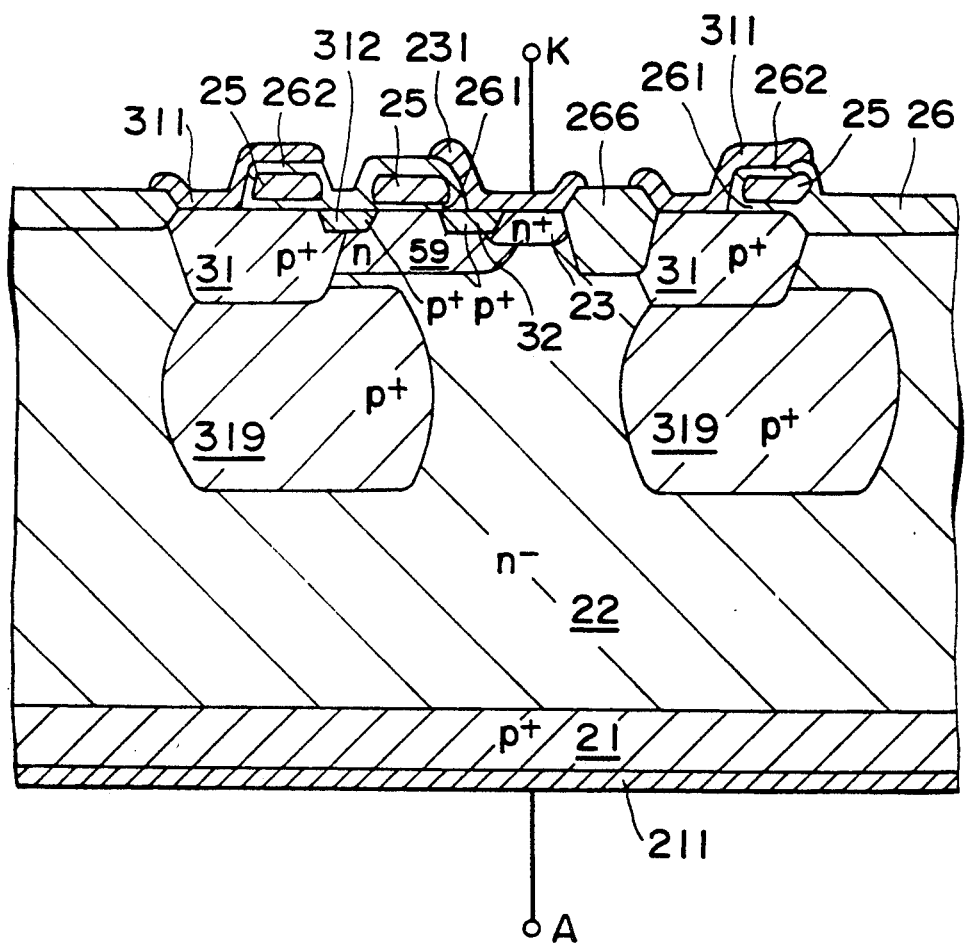
FIG. 8 is a cross-sectional view of a fourth embodiment of the invention.

FIG. 8 is a cross-sectional view of a fourth embodiment of the invention, in which, similarly to the third embodiment, floating gate electrodes 311 made of a metal film having a high conductivity are formed on each p+ gate region 31. Although not shown in FIG. 8, a contact resistance is reduced if a very thin p++ re-diffused region or the like is formed on a contact window portion between the floating gate electrodes 311 and the p+ gate areas 31. Further, if a silicide film made of a refractory metal such as $WSi_2$, $MoSi_2$ is formed between the p++ area and the floating gate electrodes 311, a gate resistance of the SI thyristor is reduced to $\frac{1}{4} \sim 1/100$. Needless to say, the aforesaid thin p++ area and the silicide film made of a refractory metal should preferably be formed on the entire surface of each of the p+ gate regions 31, not only on the contact window portion between the floating gate electrodes 311 and the p+ gate areas 31, in the third and fourth embodiments.

In FIG. 8, the width between p+ buried gate regions 319 and 319 is a narrowest in the channel, whereby the present embodiment proposes a structure in which a normally-off characteristic is easily realized. In FIG. 8, the p+ regions, or extrinsic gate regions 31 rather play a role of interconnecting regions from the p+ buried gate regions, or intrinsic gate region 319 to the floating gate electrodes 311. Operation of the main thyristor becomes approximately that of a buried gate SI thyristor.

Figure 9:
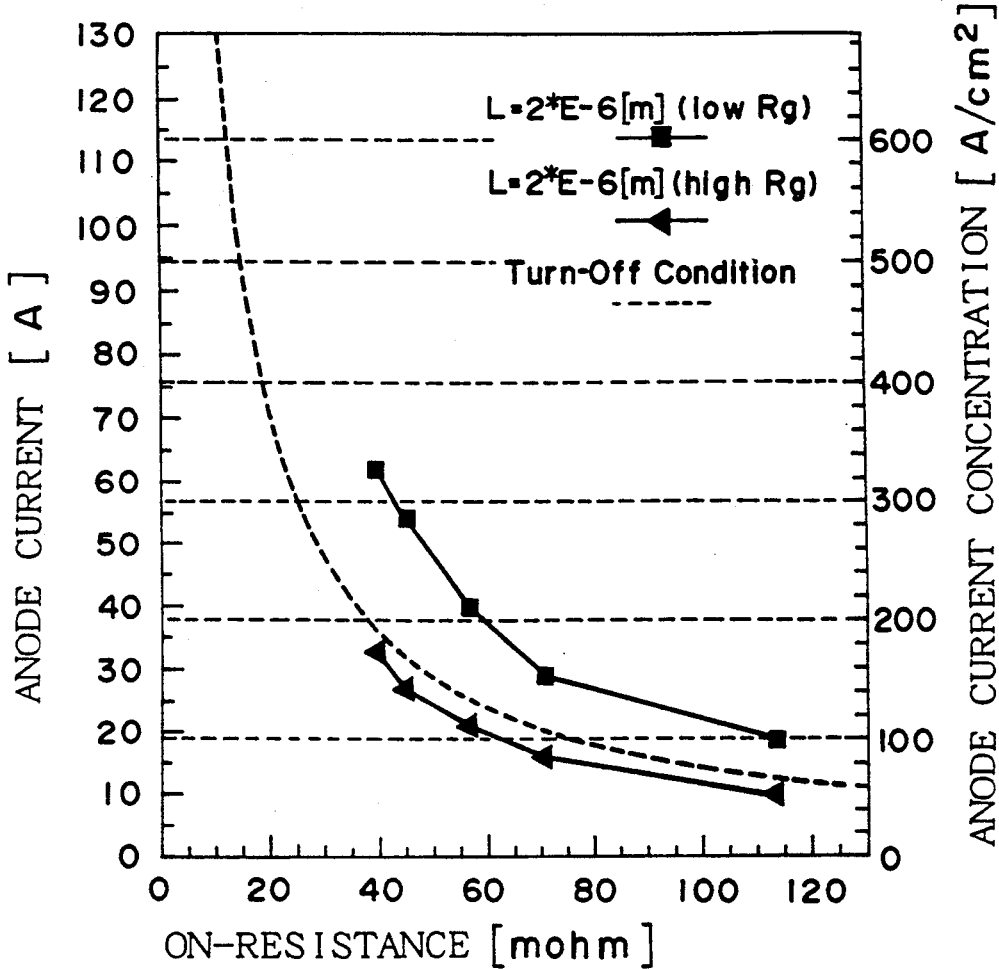
FIG. 9 is a view showing effects of a floating gate electrode in each of the third and fourth embedments.

FIG. 9 shows effects of the floating gate electrodes 311 in each of the third and fourth embodiments, a relationship between maximum turn-off anode current of the MCSITH and an ON-resistance of the pMOS transistor. The triangle symbol, ▲, indicates the case of the conventional MCSITH, while the block symbol, ■, indicates the case of the invention. According to FIG. 9, it will be apparent that maximum turn-off anode current of the present invention increases approximately twice that of the conventional example.

Figure 10:
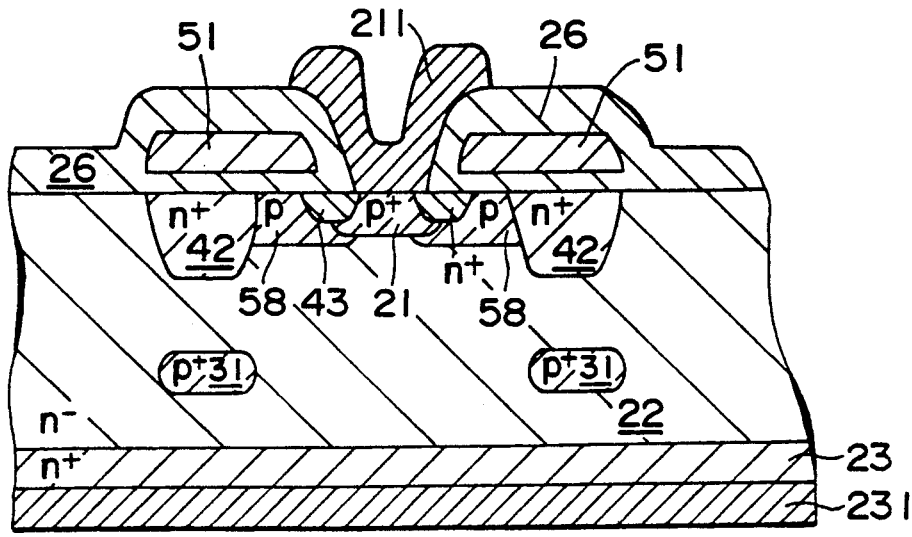
FIG. 10 is a cross-sectional view of a fifth embodiment of the invention.

FIG. 10 is a cross-sectional view of a fifth embodiment of the invention. In this case, a p-well 58 is formed between a p+ anode 21 and a second gate region 42 of a double gate SI thyristor, and an nMOS transistor having an n+ drain region 43, a n+ source region 42 and a second gate electrode 51 is formed within the p-well 58. A p+ region 31 is first gate, while a n+ region 23 is a cathode region. When a negative potential is applied to the second gate electrode 51, the potential barrier for a hole within an n− channel 22 is reduced, injecting the holes from the p+ anode region 21 to turn on this device. When a potential of the second gate electrodes 51 is brought to zero, the nMOS transistor is triggered to the on-state and electrons are extracted to an anode electrode 211 from the second gate regions 42 through the nMOS transistor, and this device is turned off. If the first gate of p+ regions 31 are omitted, the device operates as an SI thyristor of single gate type of inverted operation.

Figure 11:
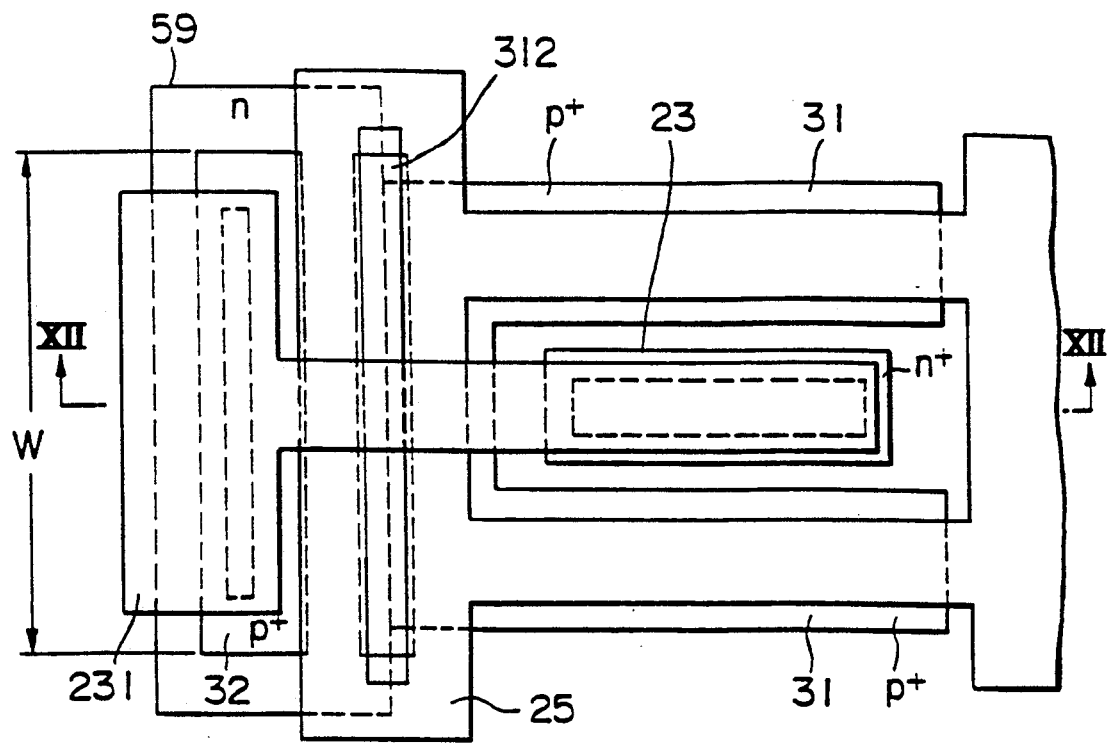
FIG. 11 is a top plan view showing a specific structure in which a MCSITH according to a sixth embodiment of the invention is integrated.
Figure 12:
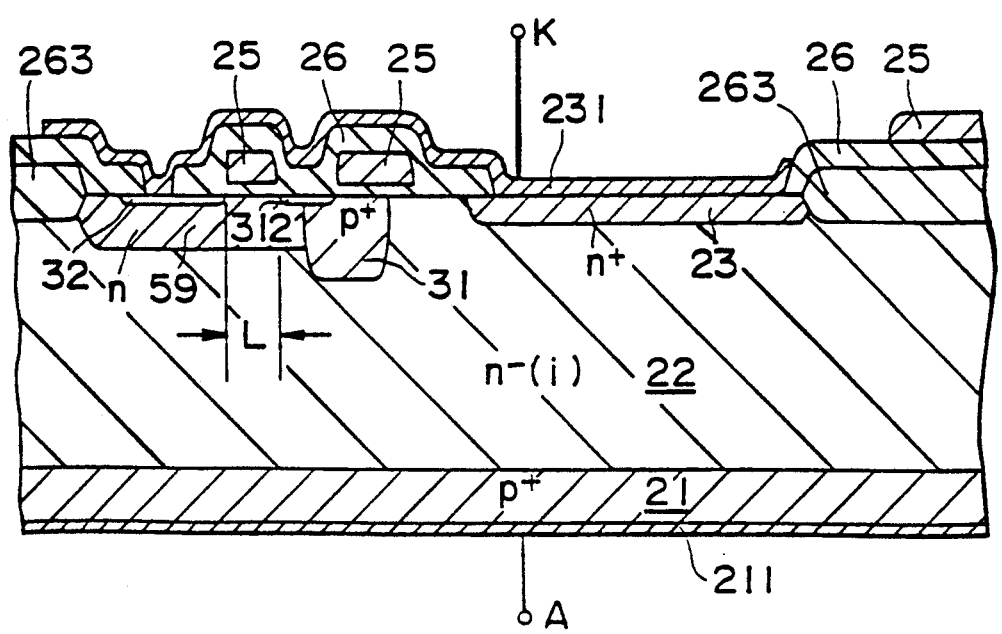
FIG. 12 is a cross-sectional view taken along a line XII—XII in FIG. 11.

FIG. 11 is a top plan view showing a specific structure in which a MCSITH according to a sixth embodiment of the invention is integrated, while FIG. 12 is a cross-sectional view taken along a line III-XII in FIG. 11.

The sixth embodiment is different from the first to fifth embodiments in that an n-well is not formed between an n+ cathode 23 and the p+ gate regions 31. Specifically, the n-well 59 is arranged on the outside of an area through which main current flows, between the cathode 23 and an anode region 21 of the SI thyristor that is a main device. A pMOS transistor is formed within the n-well 59.

The reference numerals 32 and 312 denote a p+ drain and source regions of the pMOS transistor, respectively. A plurality of gate electrodes 25 are formed only on the pMOS transistor. Since these drain, source and gate regions can be formed by a self-alignment process step which is used in a normal fabrication method of a pMOS transistor, it is possible to control variation of the gate length L to a sufficiently small value. An n+ cathode 23 and the p+ drain region 32 are electrically connected to each other through a cathode electrode 231. The reference numerals 263 denote field insulating films or the like which are formed by a well-known LOCOS process or the like.

According to the structure illustrated in FIGS. 11 and 12, it is possible to select design parameters of the pMOS transistor and the SI thyristor, independently. As a whole, the structures illustrated in FIGS. 11 and 12 have advantages that degree of freedom of design for an integrated structure is large, and manufacturing is made easy. Particularly, even if the spacing between the p+ gate regions 31 and 31 of the SI thyristor is reduced sufficiently, it is possible to flexibly select a gate length L and a gate width w of the pMOS transistor. Accordingly, it is possible to obtain simultaneously a normally-off characteristic of the SI thyristor and reduced ON-resistance of the pMOS transistor.

FIGS. 11 and 12 show a structure of a single unit where there is the simple single n+ cathode region 23. Needless to say, however, a plurality of these units, or segments can be arranged in parallel relation to each other so as to be brought to a multi-channel structure, whereby a MCSITH for large current can be realized. In this case, if the n-well 59 is formed below a cathode electrode wiring layer at which respective cathode electrodes 231 are gathered together, the pMOS transistor does not occupy so much area with respect to a whole chip area. Accordingly, area occupying efficiency does not significantly change with respect to the first to fifth embodiments. The superior area occupying efficiency can be obtained by the arrangement in which the n-well 59 is formed within the p+ gate regions 31.

Figure 13:
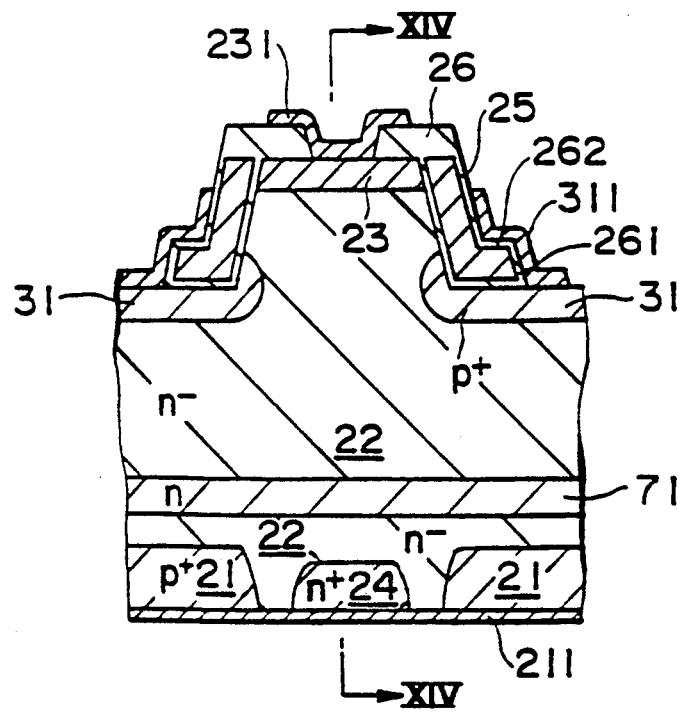
FIG. 13 is a cross-sectional view of a seventh embodiment of the invention.
Figure 14:
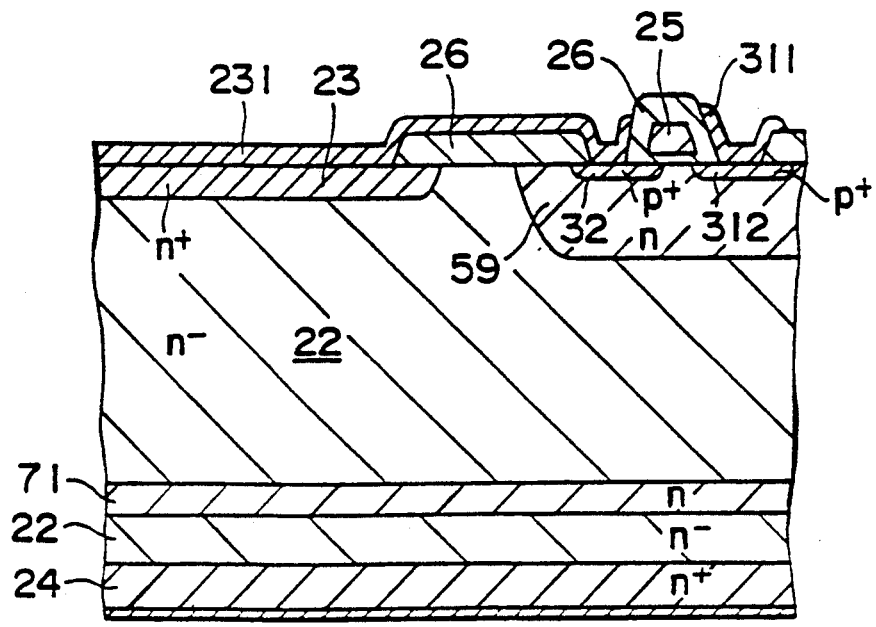
FIG. 14 is a cross-sectional view taken along a line XIV—XIV in FIG. 13.
Figure 15:
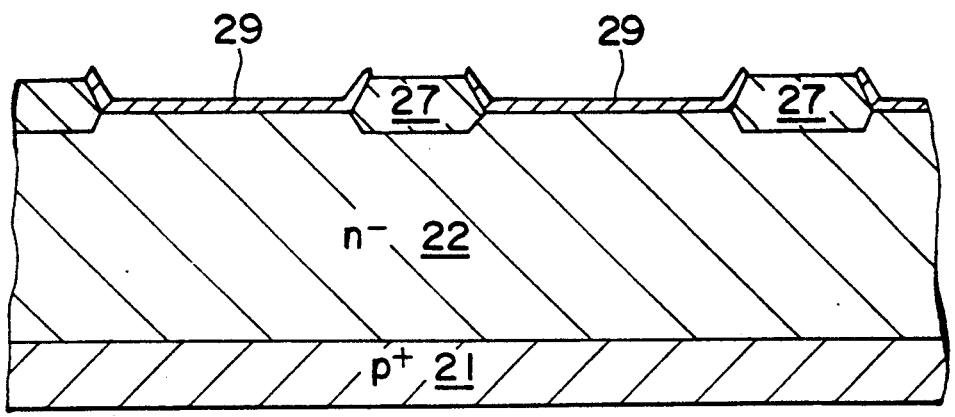
FIG. 15 is a cross-sectional view showing a first step of a manufacturing method according to an eighth embodiment of the invention.
Figure 16:
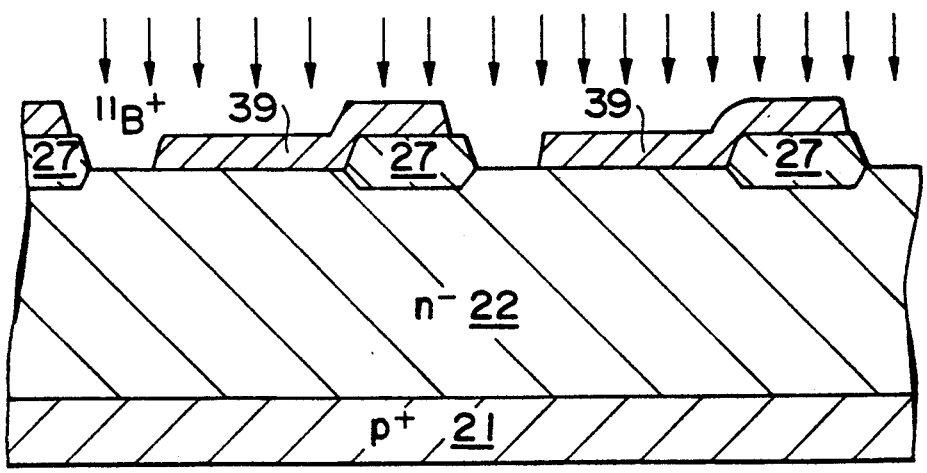
FIG. 16 is a cross-sectional view showing a second step of the manufacturing method according to the eighth embodiment of the invention.
Figure 17:
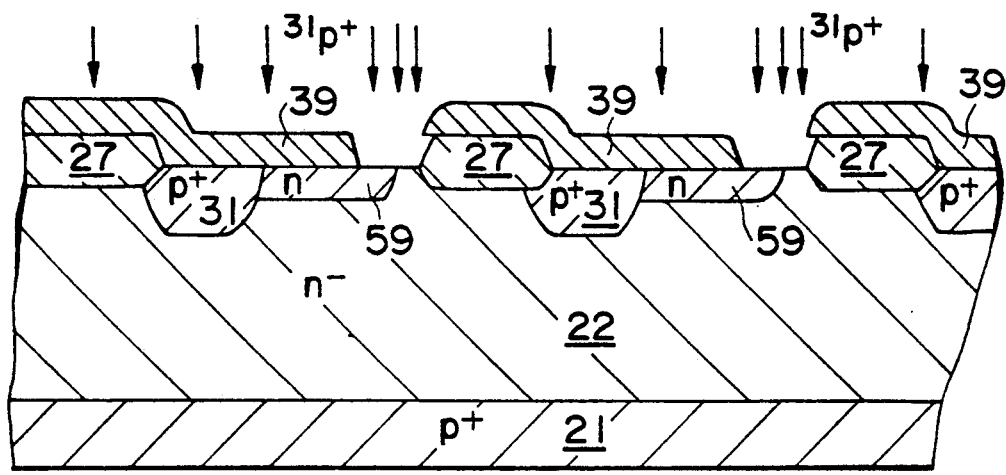
FIG. 17 is a cross-sectional view showing a third step of the manufacturing method according to the eighth embodiment of the invention.
Figure 18:
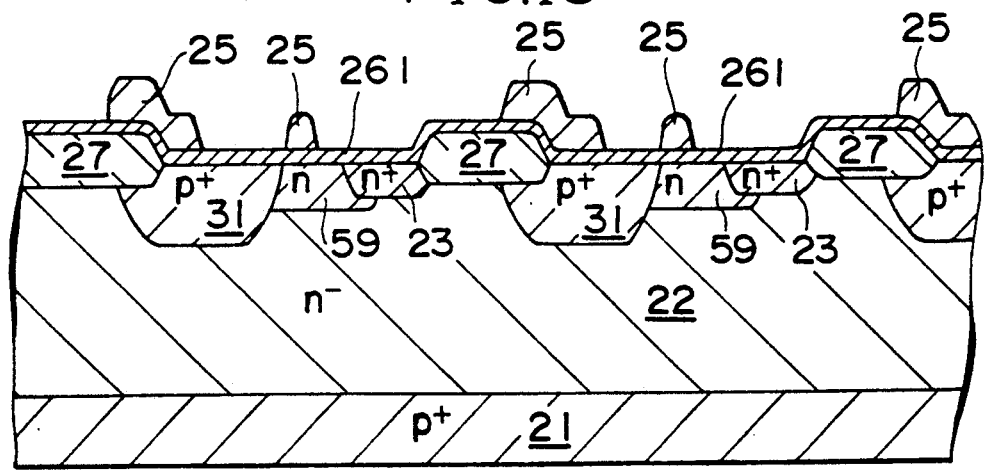
FIG. 18 is a cross-sectional view showing a fourth step of the manufacturing method according to the eighth embodiment of the invention.
Figure 19:
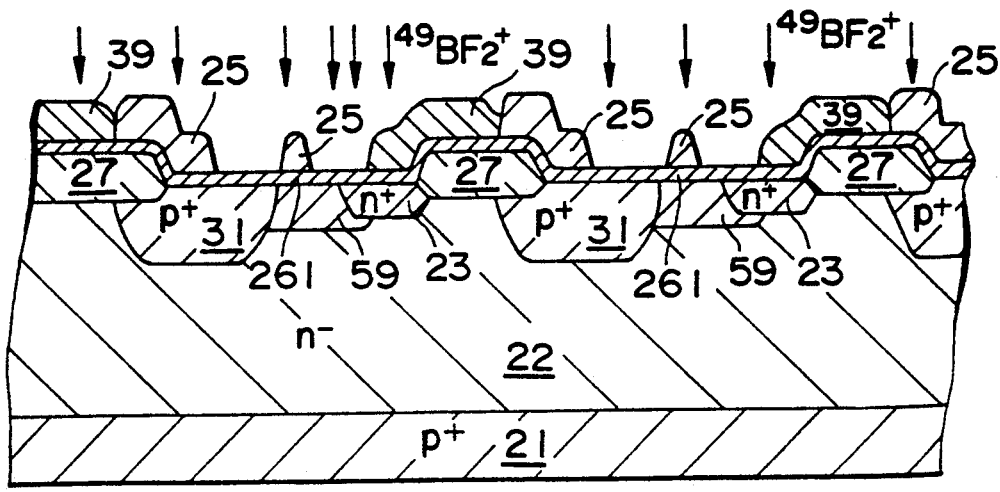
FIG. 19 is a cross-sectional view showing a fifth step of the manufacturing method according to the eighth embodiment of the invention.
Figure 20:
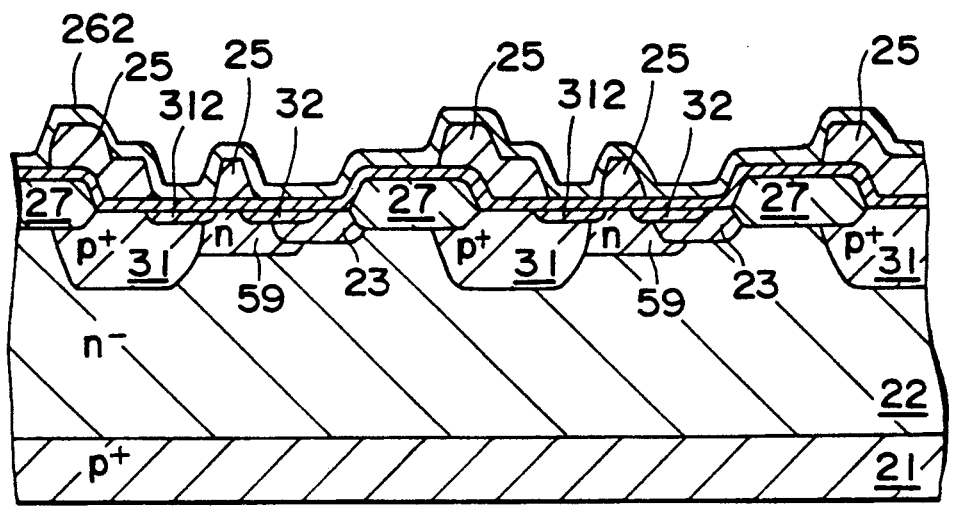
FIG. 20 is a cross-sectional view showing a sixth step of the manufacturing method according to the eighth embodiment of the invention.

FIG. 13 is a cross-sectional view of a seventh embodiment of the invention, while FIG. 14 is a cross-sectional view taken along a line XIV—XIV in FIG. 13, showing a case of a recessed gate SI thyristor. A pair of p+ gate regions 31 are formed in a bottom of a recessed groove or a trench, and an n-buffer layer 71 is formed adjacent to a pair of p+ anode regions 21. If impurity concentration of an n-buffer layer 42 is brought to $1 \times 10^{15} \sim 1 \times 10^{17}$ cm$^{-3}$, it is possible to bring impurity concentration of n$^-$ channel 22 to the extremely low level of $10^{11} \sim 10^{13}$ cm$^{-3}$, whereby an electric field strength between the p+ gate 31 and the p+ anode regions 21 is uniformized, and a depletion layer from the gate regions 31 does not reach the p+ anode regions 21. Accordingly, it is possible to increase maximum forward blocking voltage and a switching speed, reducing a forward voltage drop.

In FIG. 13, an SI anode shorted structure (or SI anode-emitter-shorted structure) is used in which each of the p+ anode regions 21 is divided into a plurality of sections, and an n+ shorted region 24 is inserted into a location between the sections. Since electrons can be diverted into the n+ shorted region 24 by a potential field between the p+ anode regions 21 and the n+ shorted region 24, turn-off tail current of the SI thyristor is reduced so that higher speed switching is made possible.

As shown in FIG. 14, an n-well 59 is formed, in a longitudinal direction along the long side of cathode stripe, on an end portion of a convexed channel 22 sandwiched in between a groove and a groove, and a p+ drain 32 and a p+ source region 312 of the p-channel MOS transistor are formed within the n-well 59. The p+ drain 32 and an n+ cathode regions 23 are connected to each other by a cathode electrode 231. The p+ diffusion regions 31 and a floating gate electrode 311 are in contact with each other at the bottom of the U-shaped groove, and the gate resistance of the SI thyristor is extremely small. The p+ gate regions 31, a first gate insulating film 261 and a gate electrode 25 cooperate with each other to form a first capacitor, and the gate electrode 25, a second gate insulating film 262 and the floating gate electrode 311 cooperate with each other to form a second capacitor. Since a gate capacitance connected to a gate region of SI thyristor increases, turning-on time is shortened. The p+ source region 312 is electrically connected to the p+ gate regions 31 by the floating gate electrode 311.

The invention should not be limited to the first to seventh embodiments described above, but may consist of a combination of some of the first to seventh embodiments. Furthermore, it is needless to say that the invention may be one in which a conductivity type is wholly reversed. Further, the arrangement may be such that the main thyristor is formed by GaAs, and the gate insulating film is formed by AlGaAs.

Figure 21:
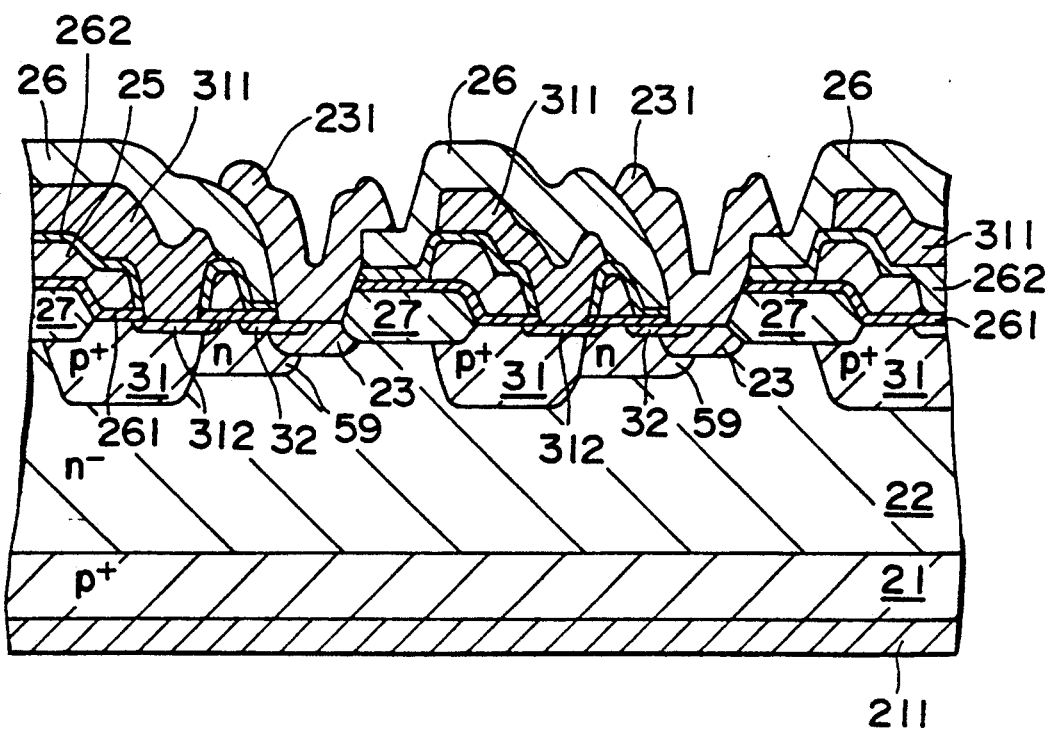
FIG. 21 is a cross-sectional view showing a final step of the manufacturing method according to the eighth embodiment of the invention.

FIGS. 15 to 21 are views showing a method of manufacturing an eighth embodiment having a structure substantially the same as that of the third embodiment. As will be clear from FIG. 21 showing a final structure of the process sequence, reduction in lateral dimension is easy by the present embodiment, in which a plurality of insulating films 26 are formed between cathode electrodes 231 and floating gate electrodes 311. The present embodiment is manufactured by the following manufacturing steps:

(1) A p+ anode area 21 of $1 \times 10^{19}$ cm$^{-3}$ whose depth is $10 \sim 30$ μm is formed on a rear surface of a n-type Si substrate having impurity density of $1 \times 10^{13}$ cm$^{-3}$ and a thickness of approximately 400 μm by a diffusion method or the like. Subsequently, silicon nitride films 29 are formed on a surface of the n-type Si substrate by a CVD method so as to have a thickness of $1300 \sim 2000$ Å. In this connection, it is preferable that a thin pad oxide film of approximately 500 Å is beforehand formed under the silicon nitride films 29. Subsequently, similarly to a LOCOS in a manufacturing step of a standard MOS transistor, a photo-lithography and a plasma etching are used to leave the silicon nitride films 29 on portions (device areas) on which the SI device according to the invention is formed. Other silicon nitride films 29 are removed. The surface of the n-type Si substrate is selectively thermally oxidized with the remaining silicon nitride films 29 serving as masks. Thus, thick field oxide films 27 of $6000 \sim 15000$ Å are formed (refer to FIG. 15).

(2) Subsequently, the silicon nitride films 29 are removed. Ions of $^{11}$B+ are implanted with photoresist films 39 serving as masks (refer to FIG. 16). Subsequently, a substrate into which the ions are implanted is heat-treated (drive-in), to form p+ gate region 31 of an SI thyristor having impurity concentration of $2 \times 10^{18} \sim 3 \times 10^{19}$ cm$^{-3}$ and a depth of $4 \sim 15$ μm. The arrangement may be such that, in place of photoresists 39, a thermal oxide film is formed, and the p+ gate regions 31 are formed by thermal diffusion. Further, the arrangement may be such that, after formation of the p+ gate region 31, the field oxide films 27 are formed by a LOCOS step.

Subsequently, ions of $^{31}$P+ are similarly implanted with the photoresist films 39 serving as masks, and drive-in is performed, to form n-well 59 having impurity concentration of $5 \times 10^{15} \sim 5 \times 10^{16}$ cm$^{-3}$ and a depth of $2 \sim 5$ μm.

In the case where the U-shaped grooves in the second embodiment are formed and are plugged by the oxide films 269, the process steps are slightly changed as follows; the gate regions 31 and the n-wells 59 of the SI thyristor are formed and, subsequently, a pad oxide film of $500 \sim 700$ Å and a silicon nitride film of $1300 \sim 2000$ Å are formed. The nitride film, the pad oxide film and the n-type Si substrate in portions which become the U-shaped grooves are etched in order to form U-shaped grooves with the photoresist films 39 serving as the mask. Further, ions of $^{31}$P+ are implanted only into the bottoms of the U-shaped grooves with the photoresist films 39 serving as masks, to form n+ channel stopper. Subsequently, if thermal oxidation (second LOCOS) is executed, oxide films are formed also on the bottoms and side walls of the U-shaped grooves. In a case where the second LOCOS is executed, the nitride films are removed and, subsequently, ions of $^{31}$P+ or $^{75}$As+ are implanted with the photoresist films 39 serving as masks (refer to FIG. 17). Subsequently, drive-in is executed to form the n+ cathode regions 23 whose impurity concentration are $4 \times 10^{19} \sim 1 \times 10^{21}$ cm$^{-3}$ and whose depths are $1 \sim 2$ μm.

(3) Subsequently, after the photoresist films 39 and the pad oxide films have been removed, the first gate oxide film 261 each having a thickness of $70 \sim 1000$ Å is formed. Ions of $^{11}$B+ are implanted with the photoresist serving as a mask, to execute channel dope of the pMOS transistor. Conditions of the channel dope in order to get a depletion pMOS transistor are that acceleration voltage $V_{ac}=30\sim50$ keV, and a dose amount $\Phi=5\times10^{12}\sim2\times10^{13}$ cm$^{-2}$ in the case, for example, where the gate length L=2 μm.

Subsequently, the photoresist is removed, polysilicon having added thereto impurities having a thickness of 3500~5000 Å (doped polysilicon: DOPOS) is formed on the gate oxide film by a CVD method. A plurality of gate electrodes 25 of the pMOS transistor are formed by anisotropic plasma etching such as RIE with the photoresist serving as a mask (refer to FIG. 18). If the gate electrodes 25 are brought to composite films in which silicide films are formed thereon, the gate resistance of the PMOS transistor is further reduced.

Subsequently, portions of the n+ cathode regions 23 are again covered with the photoresist films 39. Ions of $^{11}$B+ or $^{49}$BF$_2$+ are implanted (refer to FIG. 19). Source 312 and drain regions 32 of the pMOS transistor having impurity concentration of $3\times10^{19}\sim8\times10^{19}$ cm$^{-3}$ and a depth of 0.3~0.7 μm are formed by a self-alignment step similar to a standard process of a normal MOS transistor. Subsequently, the gate electrodes 25 of the polysilicon (DOPOS) are thermal-oxidized, or an oxide film is deposited on the entire surface by a CVD method, whereby a second gate oxide film 262 having 500~1000 Å is formed (refer to FIG. 20).

(4) Subsequently, contact windows are formed in an upper portion of each of the P+ gate regions 31. Although not shown in FIG. 21, the contact windows could be opened both on p+ gate regions 31 and p+ source regions 312. A refractory metal such as Mo, Ta, Ti, W or a silicide film thereof is formed by a CVD method, sputtering or a vacuum-evaporation method. Thus, floating gate electrodes 311 are formed by plasma etching with the photoresist serving as a mask. Moreover, thereafter, the insulating films 26 such as PSG films, polyimide films are formed on the entire surfaces of the floating gate electrodes 311 and, thereafter, contact windows for taking out the cathode electrodes 231 are formed by plasma etching or the like. A metal film having high conductivity such as Al is vacuum-evaporated with a thickness of 3500~4000 Å on the entire surface. Subsequently, the cathode electrodes 231 are defined by the use of the plasma etching (refer to FIG. 21). Subsequently, sintering is executed within vacuum or within inert gas, whereby this device is completed. In the case where there is a room in lateral pattern dimension on the surface, the insulating films 26 may be omitted, and the floating gate electrodes 311 and the cathode electrodes 231 may be formed simultaneously by Al.

Figure 22:
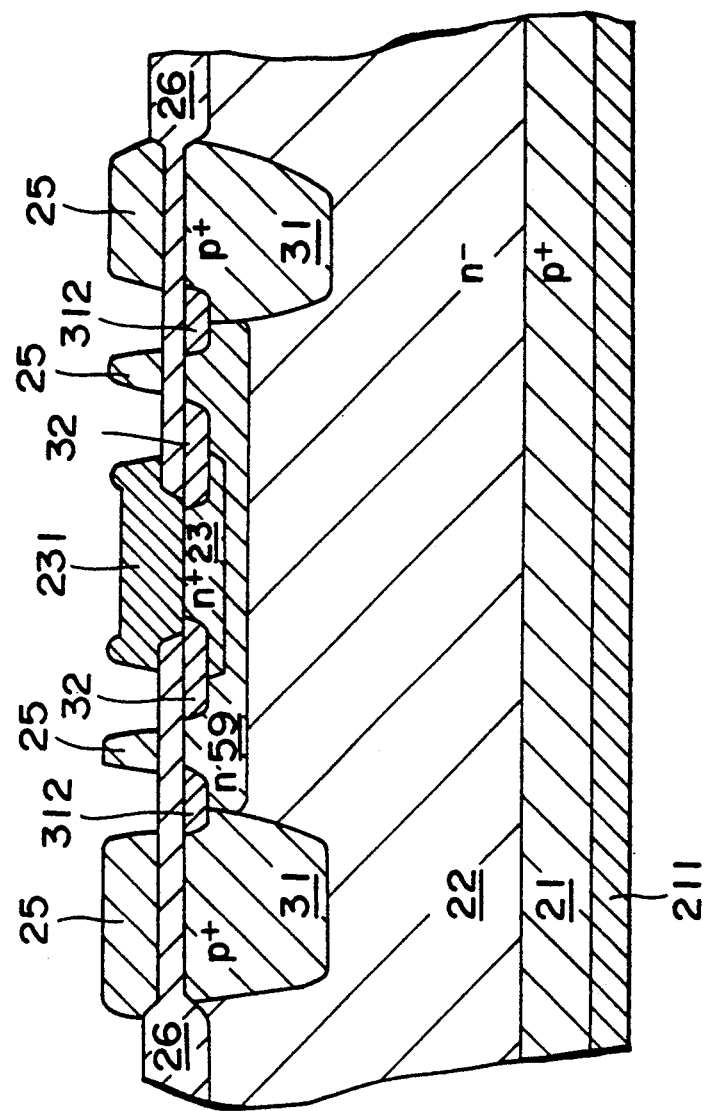
FIG. 22 is a cross-sectional view of a ninth embodiment of the invention.
Figure 23:
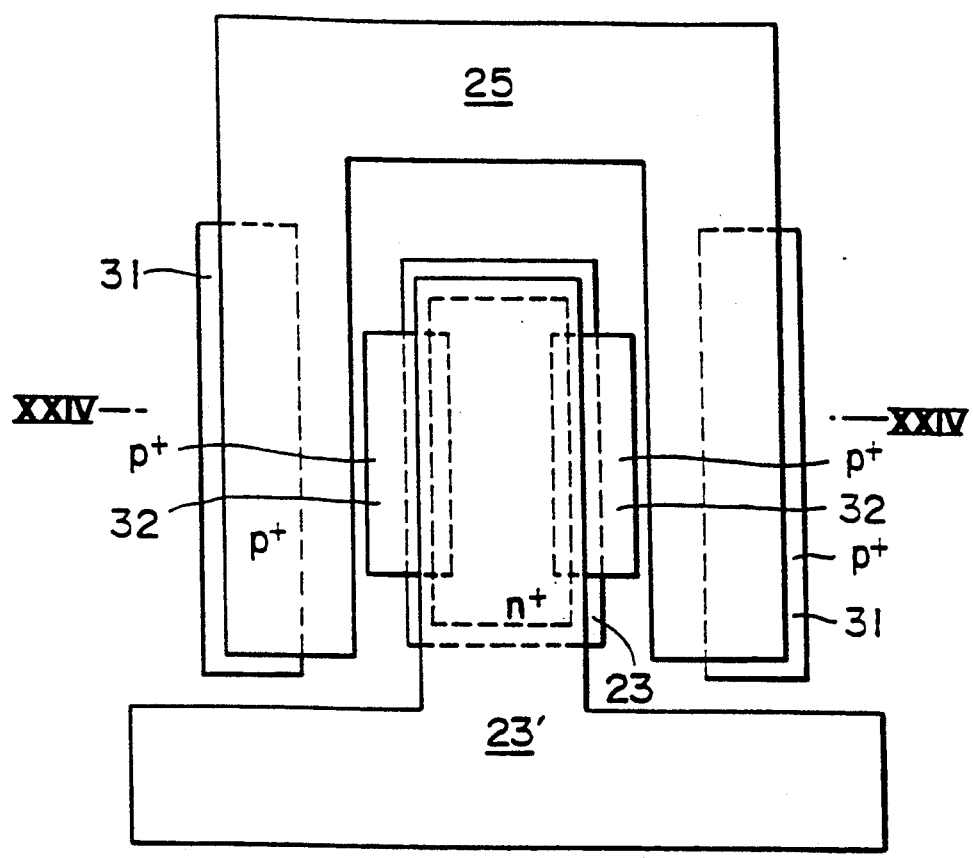
FIG. 23 is a top plan view of the prior art.
Figure 24:
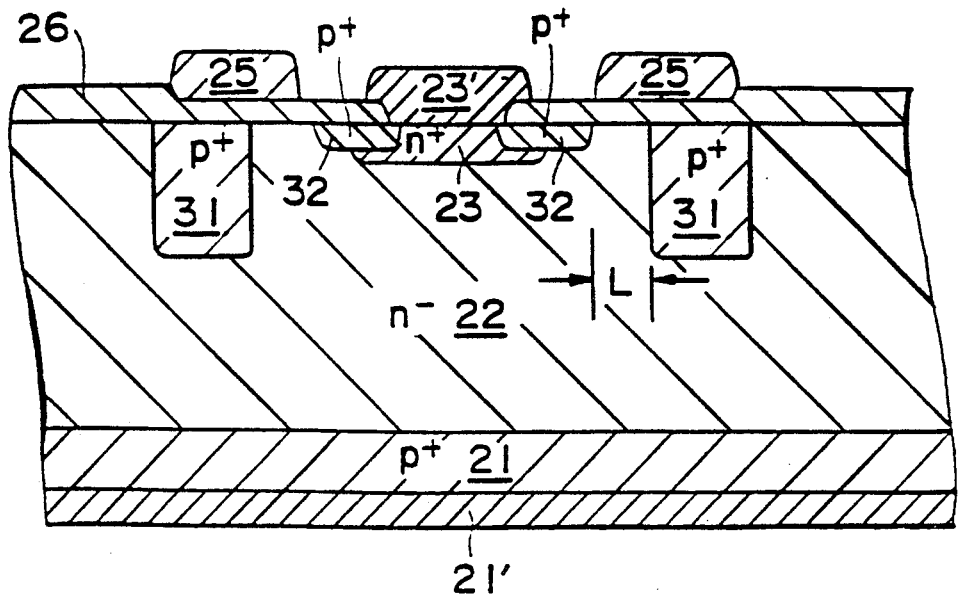
FIG. 24 is a cross-sectional view taken along a line XXIV—XXIV in FIG. 23.
Figure 25:
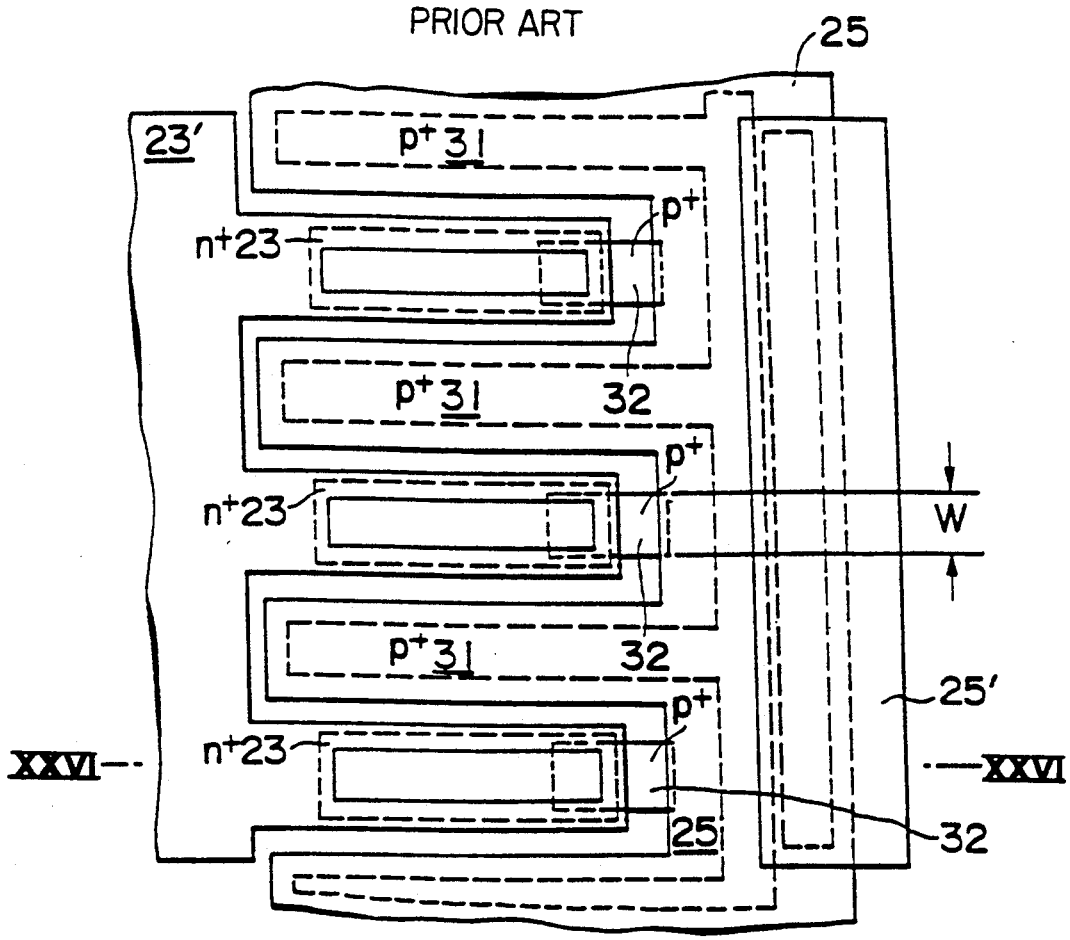
FIG. 25 is a top plan view of another prior art.
Figure 26:
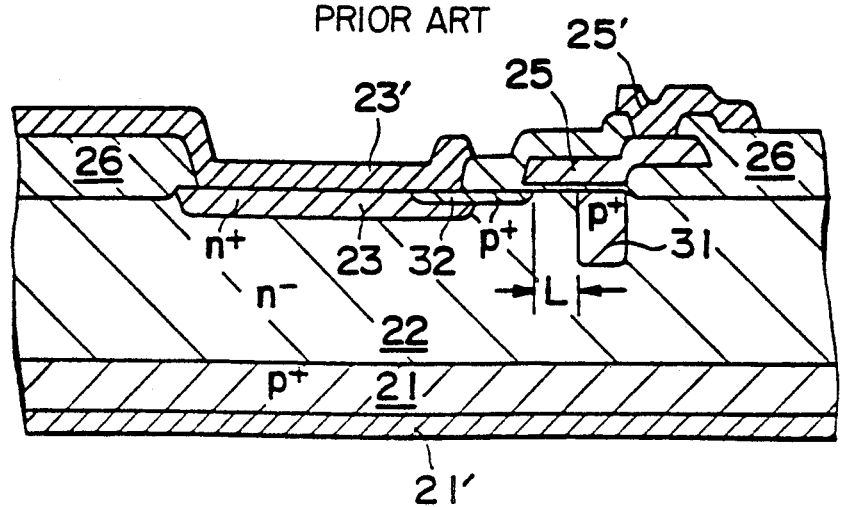
FIG. 26 is a cross-sectional view taken along a line XXVI—XXVI in FIG. 25.

Moreover, FIG. 22 is a cross-sectional view of a ninth embodiment of the invention. In this case, an n-well 59 is so formed as to include two pMOS transistors arranged respectively at both sides of an n+ cathode region 23.

As described above, the SI device according to the invention can be extremely easily manufactured by application of the manufacturing steps of a standard MOS transistor.

What is claimed is:

1. A static induction device comprising:

a static induction thyristor at least having a cathode region of first conductivity type having high impurity concentration, an anode region and a pair of gate regions of second conductivity type having high impurity concentration, and a channel of first conductivity type having low impurity concentration;

an insulated gate transistor at least having a well of first conductivity type formed on a part of a surface of said channel, said well having impurity concentration higher than that of said channel, a drain region of second conductivity type having high impurity concentration, said drain region being formed within said well, a source region that is selected from one of said gate region and a region of second conductivity type having high impurity concentration, which is electrically connected to said gate region, a gate insulating film formed on said well, and a gate electrode formed on said gate insulating film; and a capacitor comprising said gate region, said gate insulating film formed on said gate region, and said gate electrode, wherein said static induction thyristor, said insulated gate transistor and said capacitor are merged onto a single monolithic chip, wherein said cathode and drain region at least have a structure connected to each other through a cathode electrode, and wherein control voltage is applied to said gate electrode to control conduction and blocking of main current flowing between said cathode and anode regions.

2. A static induction device comprising:

a static induction thyristor at least having a cathode region of first conductivity type having high impurity concentration, an anode region and a pair of gate regions of second conductivity type having high impurity concentration, and a channel of first conductivity type having low impurity concentration;

an insulated gate transistor at least having a well of first conductivity type formed on a part of a surface of said channel, said well having impurity concentration higher than that of said channel, a drain region of second conductivity type having high impurity concentration, said drain region being formed within said well, a source region that is a region selected from one of said gate region and a region of second conductivity type having high impurity concentration, which is electrically connected to said gate region, and gate insulating film formed on said well, and a gate electrode formed on said gate insulating film; and a capacitor comprising said gate region, said gate insulating film formed on said gate region and said gate electrode, wherein said static induction thyristor, said insulated gate transistor and said capacitor are merged onto a single monolithic chip, wherein said static induction device at least has a structure in which said cathode and drain regions are connected to each other through a cathode electrode, and an isolation region between said drain region and said gate region is formed on at least a part of a region which does not include the channel of said insulated gate transistor, and wherein control voltage is applied to said gate electrode to control conduction and blocking of main current flowing between said cathode and anode regions.

3. A static induction device comprising:

a static induction thyristor at least having a cathode region of first conductivity type having high impurity concentration, an anode region and a pair of gate regions of second conductivity type having high impurity concentration, floating gate electrodes formed in contact with said gate regions, and a channel of first conductivity type having low impurity concentration;

an insulated gate transistor at least having a well of first conductivity type formed on a part of a surface of said channel, said well having impurity concentration higher than that of said channel, a drain region of second conductivity type having high impurity concentration, said drain region being formed within said well, a source region that is a region selected from one of said gate region and a region of second conductivity type having high impurity concentration, which is electrically connected to said gate region, a first gate insulating film formed on said well, and a gate electrode formed on said gate insulating film;

a first capacitor comprising said gate region, said first gate insulating film formed on said gate region and said gate electrode; and a second capacitor comprising said gate electrode, a second gate insulating film formed at least on a portion selected from a part of one of an upper portion of said gate electrode and a side portion of said gate electrode, and said floating gate electrode formed on one of an upper or a side portion of said second gate insulating film, wherein said static induction thyristor, said insulated gate transistor, said first and second capacitor are merged onto a single monolithic chip, wherein said static induction device at least has a structure in which said cathode and drain region are connected to each other through a cathode electrode, and wherein control voltage is applied to said gate electrode to control conduction and blocking of main current flowing between said cathode and anode region.

4. A static induction device according to claim 3, including an isolation region between said cathode and gate regions on location in an opposite direction to said drain region.

5. A static induction device according to claim 3, including a thin layer of second conductivity type having higher impurity concentration than said gate region, being arranged at a location where said floating gate electrode is in contact with said gate region.

6. A static induction device according to claim 1, including a buried gate region within said channel formed deeper portion than said gate region, said buried gate region being in contact with said gate region.

7. A static induction device comprising:
a double-gate static induction thyristor at least having a semiconductor substrate having low impurity density, a cathode region or first conductivity type being formed on a part of a first main surface of said semiconductor substrate, a pair of first gate region of second conductivity type, a pair of second gate regions of first conductivity type having high impurity concentration being formed on a part of a second main surface opposite to said first main surface and an anode region of second conductivity type being formed on a part of said second main surface, an insulated gate transistor at least having a well of second conductivity type formed on a part of said second main surface, a drain region of first conductivity type being formed within said well, a source region of first conductivity type being electrically connected to said second gate region, a gate insulating film formed on said well, an a gate electrode formed on said gate insulating film, a capacitor comprising said second gate region, said gate insulating film, and said gate electrode, wherein said double-gate static induction thyristor, said insulated gate transistor and said capacitor are merged onto a single monolithic chip, and wherein control voltage is applied to said gate electrode to control conduction and blocking of main current flowing between said cathode and said anode regions.

8. A static induction device according to claim 1, wherein said well is formed at a location spaced from said cathode region, and arranged outside of an area through which said main current flows.

9. A static induction device comprising:
a static induction thyristor at least having a cathode region of first conductivity type having high impurity concentration, an anode region and a pair of gate regions of second conductivity type having high impurity concentration, floating gate electrodes formed in contact with said gate regions, and a channel of first conductivity type having low impurity concentration;

an insulated gate transistor at least having a well of first conductivity type formed on a part of a surface of said channel, said well having impurity concentration higher than that of said channel, a drain region of second conductivity type having high impurity concentration formed within said well, a source region of second conductivity type having high impurity concentration electrically connected to said gate region through said floating gate electrodes, a first gate insulating film formed on said well, and a gate electrode formed on said first gate insulating film;

a pair of first capacitors comprising said gate regions, said first gate insulating films formed on said gate regions, and said gate electrode; and a pair of second capacitors comprising said gate electrode, second gate insulating films formed at least on a portion selected from one of part of an upper portion of said gate electrode and a side portion of said gate electrode, and said floating gate electrodes formed on a portion selected from one of an upper portion of said second gate insulating films and a side portion of said second gate insulating films;

wherein said static induction thyristor, said insulated gate transistor, said first and second capacitors are merged onto a single monolithic chip, wherein said cathode and drain region are connected to each other through a cathode electrode, wherein said static induction device has at least a structure in which said gate regions are formed in grooves, said gate electrode is formed on a side wall of said grooves, and said well is formed in a longitudinal direction along a long side of lateral pattern of said cathode region on an end portion of a convexed channel between said grooves, and wherein control voltage is applied to said gate electrode to control conduction and blocking of main current flowing between said cathode and anode regions.

10. A static induction device according to claim 1, including an insulating film formed on an upper portion of said floating electrode and between said cathode electrode and said floating gate electrode.

11. A static induction device according to claim 1, wherein said cathode region is arranged at a center between adjacent gate regions, insulated gate transistor are formed at both sides of said cathode region, and said well is so formed as to include said cathode region and an insulated gate transistor.

12. A static induction device according to any one of claims 1 to 11, wherein said anode region is divided into a plurality of sections, and a region of first conductivity type having high impurity concentration is formed between said plurality of divided sections.

13. A static induction device according to any one of claims 1 to 11, including layer of first conductivity type, arranged adjacent to said anode region.

* * * * *